United States Patent
Fox

(10) Patent No.: US 8,847,622 B2
(45) Date of Patent: *Sep. 30, 2014

(54) MICRO-GRANULAR DELAY TESTING OF CONFIGURABLE ICS

(75) Inventor: Brian Fox, Sunnyvale, CA (US)

(73) Assignee: Tabula, Inc., Mountain View, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/291,095

(22) Filed: Nov. 7, 2011

(65) Prior Publication Data

US 2012/0112786 A1    May 10, 2012

Related U.S. Application Data

(63) Continuation of application No. 12/785,484, filed on May 23, 2010, now Pat. No. 8,072,234.

(60) Provisional application No. 61/244,425, filed on Sep. 21, 2009, provisional application No. 61/320,692, filed on Apr. 2, 2010.

(51) Int. Cl.
*H03K 19/00* (2006.01)
*G01R 31/3185* (2006.01)
*H03K 19/177* (2006.01)

(52) U.S. Cl.
CPC *G01R 31/318516* (2013.01); *G01R 31/318519* (2013.01); *H03K 19/17764* (2013.01)
USPC ...................... 326/16; 326/9; 326/39; 326/41

(58) Field of Classification Search
None
See application file for complete search history.

(56) References Cited

U.S. PATENT DOCUMENTS

| | | | |
|---|---|---|---|
| 5,425,036 | A | 6/1995 | Liu et al. |
| 5,578,946 | A | 11/1996 | Carberry et al. |
| 5,596,743 | A | 1/1997 | Bhat et al. |
| 5,650,734 | A | 7/1997 | Chu et al. |
| 5,654,650 | A | 8/1997 | Gissel |
| 5,732,246 | A | 3/1998 | Gould et al. |
| 5,751,735 | A | 5/1998 | Tobin et al. |
| 5,811,985 | A | 9/1998 | Trimberger et al. |

(Continued)

FOREIGN PATENT DOCUMENTS

| | | |
|---|---|---|
| EP | 0748053 | 12/1996 |
| EP | 2174215 | 4/2010 |

(Continued)

OTHER PUBLICATIONS

Portions of prosecution history of U.S. Appl. No. 11/375,562, Jun. 24, 2010, Redgrave, Jason, et al.

(Continued)

*Primary Examiner* — Anh Tran
(74) *Attorney, Agent, or Firm* — Adeli LLP

(57) ABSTRACT

A method for testing a set of circuitry in an integrated circuit (IC) is described. The IC includes multiple configurable circuits for configurably performing multiple operations. The method configures the IC to operate in a user mode with a set of test paths that satisfies a set of evaluation criteria. Each test path includes a controllable storage element for controllably storing a signal that the storage element receives. The method operates the IC in user mode. The method reads the values stored in the storage elements to determine whether the set of circuitry is operating within specified performance limits.

21 Claims, 25 Drawing Sheets

(56) References Cited

U.S. PATENT DOCUMENTS

| | | | |
|---|---|---|---|
| 5,822,217 A | 10/1998 | Shenoy | |
| 5,920,712 A | 7/1999 | Kuijsten | |
| 5,944,813 A | 8/1999 | Trimberger | |
| 6,003,150 A * | 12/1999 | Stroud et al. | 714/725 |
| 6,018,559 A | 1/2000 | Azegami et al. | |
| 6,020,758 A | 2/2000 | Patel et al. | |
| 6,107,821 A | 8/2000 | Kelem et al. | |
| 6,172,521 B1 | 1/2001 | Motomura | |
| 6,182,247 B1 | 1/2001 | Herrmann et al. | |
| 6,204,687 B1 | 3/2001 | Schultz et al. | |
| 6,389,558 B1 | 5/2002 | Herrmann et al. | |
| 6,404,224 B1 | 6/2002 | Azegami et al. | |
| 6,421,784 B1 | 7/2002 | Chu et al. | |
| 6,446,249 B1 | 9/2002 | Wang et al. | |
| 6,459,646 B1 | 10/2002 | Yee et al. | |
| 6,460,148 B2 | 10/2002 | Veenstra et al. | |
| 6,480,954 B2 | 11/2002 | Trimberger et al. | |
| 6,539,535 B2 | 3/2003 | Butts et al. | |
| 6,546,464 B2 | 4/2003 | Fortuna et al. | |
| 6,614,703 B2 | 9/2003 | Pitts et al. | |
| 6,631,520 B1 | 10/2003 | Theron et al. | |
| 6,658,564 B1 | 12/2003 | Smith et al. | |
| 6,668,237 B1 | 12/2003 | Guccione et al. | |
| 6,681,353 B1 | 1/2004 | Barrow | |
| 6,684,348 B1 | 1/2004 | Edwards et al. | |
| 6,691,266 B1 | 2/2004 | Winegarden et al. | |
| 6,691,301 B1 | 2/2004 | Bowen | |
| 6,701,494 B2 | 3/2004 | Giddens et al. | |
| 6,704,889 B2 | 3/2004 | Veenstra et al. | |
| 6,711,729 B1 | 3/2004 | McElvain et al. | |
| 6,725,442 B1 | 4/2004 | Cote et al. | |
| 6,748,456 B1 | 6/2004 | Stanton et al. | |
| 6,750,675 B2 | 6/2004 | Venkata et al. | |
| 6,791,352 B2 | 9/2004 | Verdoorn et al. | |
| 6,802,026 B1 | 10/2004 | Patterson et al. | |
| 6,810,442 B1 | 10/2004 | Lin et al. | |
| 6,810,513 B1 | 10/2004 | Vest | |
| 6,823,224 B2 | 11/2004 | Wood et al. | |
| 6,829,751 B1 | 12/2004 | Shen et al. | |
| 6,889,368 B1 | 5/2005 | Mark et al. | |
| 6,897,678 B2 | 5/2005 | Zaveri et al. | |
| 6,898,776 B1 | 5/2005 | Jacobson et al. | |
| 6,937,681 B2 | 8/2005 | Watanabe | |
| 6,954,916 B2 | 10/2005 | Bernstein et al. | |
| 6,959,397 B2 | 10/2005 | Cafaro et al. | |
| 6,996,738 B2 | 2/2006 | Chiang | |
| 7,010,667 B2 | 3/2006 | Vorbach et al. | |
| 7,064,577 B1 | 6/2006 | Lee | |
| 7,085,858 B1 | 8/2006 | Fox et al. | |
| 7,095,247 B1 | 8/2006 | Tang et al. | |
| 7,112,992 B1 | 9/2006 | Guzman et al. | |
| 7,120,883 B1 | 10/2006 | van Antwerpen et al. | |
| 7,126,373 B1 | 10/2006 | Schmit et al. | |
| 7,143,329 B1 | 11/2006 | Trimberger et al. | |
| 7,157,933 B1 | 1/2007 | Schmit et al. | |
| 7,171,548 B2 | 1/2007 | Smith et al. | |
| 7,191,372 B1 | 3/2007 | Jacobson et al. | |
| 7,193,440 B1 | 3/2007 | Schmit et al. | |
| 7,200,776 B2 | 4/2007 | Harris | |
| 7,218,137 B2 | 5/2007 | Vadi et al. | |
| 7,219,265 B2 | 5/2007 | Yee | |
| 7,224,182 B1 | 5/2007 | Hutchings et al. | |
| 7,230,869 B1 | 6/2007 | Redgrave et al. | |
| 7,231,339 B1 | 6/2007 | Nemecek et al. | |
| 7,233,169 B1 | 6/2007 | Vadi | |
| 7,298,169 B2 | 11/2007 | Hutchings et al. | |
| 7,308,564 B1 | 12/2007 | Jenkins, IV | |
| 7,330,912 B1 | 2/2008 | Fox et al. | |
| 7,375,550 B1 | 5/2008 | Redgrave et al. | |
| 7,409,652 B1 | 8/2008 | Fox et al. | |
| 7,412,343 B2 | 8/2008 | Stroud et al. | |
| 7,424,655 B1 | 9/2008 | Trimberger | |
| 7,443,196 B2 | 10/2008 | Redgrave et al. | |
| 7,454,658 B1 | 11/2008 | Baxter | |
| 7,467,335 B2 | 12/2008 | Otto et al. | |
| 7,492,186 B2 | 2/2009 | Hutchings et al. | |
| 7,501,855 B2 | 3/2009 | Hutchings et al. | |
| 7,512,850 B2 | 3/2009 | Redgrave et al. | |
| 7,548,085 B2 | 6/2009 | Hutchings et al. | |
| 7,548,090 B2 | 6/2009 | Redgrave et al. | |
| 7,550,991 B2 | 6/2009 | Redgrave et al. | |
| 7,576,557 B1 | 8/2009 | Tseng et al. | |
| 7,576,558 B1 | 8/2009 | Lysaght et al. | |
| 7,579,867 B2 | 8/2009 | Hutchings et al. | |
| 7,589,557 B1 | 9/2009 | Bergendahl et al. | |
| 7,595,655 B2 | 9/2009 | Hutchings et al. | |
| 7,650,248 B1 | 1/2010 | Baxter | |
| 7,652,498 B2 | 1/2010 | Hutchings et al. | |
| 7,696,780 B2 | 4/2010 | Hutchings et al. | |
| 7,702,978 B2 | 4/2010 | Lewis et al. | |
| 7,728,617 B2 | 6/2010 | Redgrave et al. | |
| 7,743,296 B1 | 6/2010 | Pierce et al. | |
| 7,786,749 B1 | 8/2010 | Syu et al. | |
| 7,788,478 B2 | 8/2010 | Redgrave et al. | |
| 7,805,593 B1 | 9/2010 | Donlin | |
| 7,818,705 B1 | 10/2010 | Hutton et al. | |
| 7,839,162 B2 | 11/2010 | Hutchings | |
| 7,886,247 B2 | 2/2011 | Fatemi et al. | |
| 7,973,558 B2 | 7/2011 | Hutchings et al. | |
| 8,037,340 B2 | 10/2011 | Kim et al. | |
| 8,067,960 B2 | 11/2011 | Hutchings et al. | |
| 8,069,425 B2 | 11/2011 | Hutchings et al. | |
| 8,072,234 B2 * | 12/2011 | Fox | 326/16 |
| 8,115,510 B2 | 2/2012 | Redgrave et al. | |
| 8,143,915 B2 | 3/2012 | Hutchings | |
| 8,295,428 B2 | 10/2012 | Hutchings et al. | |
| 8,412,990 B2 | 4/2013 | Hutchings et al. | |
| 8,429,579 B2 | 4/2013 | Hutchings et al. | |
| 8,433,891 B2 | 4/2013 | Redgrave et al. | |
| 8,479,069 B2 | 7/2013 | Miller et al. | |
| 8,525,548 B2 | 9/2013 | Hutchings et al. | |
| 8,598,909 B2 | 12/2013 | Hutchings | |
| 2001/0033188 A1 | 10/2001 | Aung et al. | |
| 2001/0037477 A1 | 11/2001 | Veenstra et al. | |
| 2002/0089349 A1 | 7/2002 | Barbier et al. | |
| 2002/0093371 A1 | 7/2002 | Atkinson | |
| 2002/0194543 A1 | 12/2002 | Veenstra et al. | |
| 2003/0033584 A1 | 2/2003 | Zaveri et al. | |
| 2003/0100133 A1 | 5/2003 | Eidson et al. | |
| 2003/0110430 A1 | 6/2003 | Bailis et al. | |
| 2003/0182638 A1 | 9/2003 | Gupta et al. | |
| 2003/0217345 A1 | 11/2003 | Rajsuman et al. | |
| 2004/0041610 A1 | 3/2004 | Kundu | |
| 2004/0225970 A1 | 11/2004 | Oktem | |
| 2004/0236534 A1 | 11/2004 | Wheless, Jr. et al. | |
| 2005/0046458 A1 | 3/2005 | Schroeder et al. | |
| 2005/0132316 A1 | 6/2005 | Suaris et al. | |
| 2005/0216671 A1 | 9/2005 | Rothman et al. | |
| 2006/0125517 A1 | 6/2006 | van Wageningen et al. | |
| 2006/0176075 A1 | 8/2006 | Or-Bach | |
| 2006/0251416 A1 | 11/2006 | Letner et al. | |
| 2007/0006053 A1 | 1/2007 | Otto et al. | |
| 2007/0007999 A1 | 1/2007 | Graham et al. | |
| 2007/0143577 A1 | 6/2007 | Smith | |
| 2007/0226541 A1 | 9/2007 | Brunot et al. | |
| 2008/0028347 A1 | 1/2008 | Hiraoglu et al. | |
| 2008/0122484 A1 | 5/2008 | Zhu et al. | |
| 2008/0276208 A1 | 11/2008 | Albrecht et al. | |
| 2008/0304425 A1 | 12/2008 | Karaoguz | |
| 2009/0002020 A1 | 1/2009 | Hutchings et al. | |
| 2009/0237110 A1 | 9/2009 | Lunzer et al. | |
| 2011/0029830 A1 | 2/2011 | Miller et al. | |
| 2011/0060546 A1 | 3/2011 | Miller et al. | |
| 2011/0060896 A1 | 3/2011 | Redgrave et al. | |
| 2011/0199117 A1 | 8/2011 | Hutchings et al. | |
| 2011/0206176 A1 | 8/2011 | Hutchings et al. | |
| 2012/0098567 A1 | 4/2012 | Hutchings et al. | |
| 2012/0117525 A1 | 5/2012 | Hutchings et al. | |
| 2012/0200314 A1 | 8/2012 | Hutchings | |
| 2013/0156146 A1 | 6/2013 | Hutchings et al. | |

(56) References Cited

U.S. PATENT DOCUMENTS

FOREIGN PATENT DOCUMENTS

| EP | 2279560 | 2/2011 |
|---|---|---|
| WO | WO 2009/002600 | 12/2008 |
| WO | WO 2009/039462 | 3/2009 |
| WO | WO 2009/131569 | 10/2009 |
| WO | WO 2010/016857 | 2/2010 |
| WO | WO 2011/035076 | 3/2011 |

OTHER PUBLICATIONS

Portions of prosecution history of U.S. Appl. No. 12/870,779, Sep. 24, 2012, Redgrave, Jason, et al.
Portions of prosecution history of U.S. Appl. No. 11/375,362, Feb. 14, 2008, Redgrave, Jason, et al.
Portions of prosecution history of U.S. Appl. No. 12/050,897, Feb. 4, 2009, Redgrave, Jason, et al.
Portions of prosecution history of U.S. Appl. No. 11/375,363, Sep. 26, 2008, Redgrave, Jason, et al.
Portions of prosecution history of U.S. Appl. No. 12/235,581, Apr. 2, 2010, Redgrave, Jason, et al.
Portions of prosecution history of U.S. Appl. No. 12/754,603, Nov. 9, 2011, Redgrave, Jason, et al.
Portions of prosecution history of U.S. Appl. No. 11/375,370, Feb. 13, 2009, Redgrave, Jason, et al.
Portions of prosecution history of U.S. Appl. No. 11/375,369, Jan. 27, 2009, Redgrave, Jason, et al.
Portions of prosecution history of U.S. Appl. No. 11/375,364, Jan. 15, 2009, Hutchings, Brad, et al.
Portions of prosecution history of U.S. Appl. No. 12/106,257, Nov. 16, 2009, Hutchings, Brad, et al.
Portions of prosecution history of U.S. Appl. No. 12/754,604, Jun. 27, 2011, Hutchings, Brad, et al.
Portions of prosecution history of U.S. Appl. No. 13/281,425, Jan. 10, 2012, Hutchings, Brad, et al.
Portions of prosecution history of U.S. Appl. No. 11/375,561, Jan. 30, 2009, Hutchings, Brad, et al.
Portions of prosecution history of U.S. Appl. No. 11/769,680, Nov. 4, 2011, Hutchings, Brad, et al.
Portions of prosecution history of U.S. Appl. No. 13/291,087, Oct. 4, 2012, Hutchings, Brad, et al.
Portions of prosecution history of U.S. Appl. No. 11/769,683, Sep. 4, 2012, Hutchings, Brad, et al.
Portions of prosecution history of U.S. Appl. No. 11/769,686, May 15, 2009, Hutchings, Brad, et al.
Portions of prosecution history of U.S. Appl. No. 11/769,706, May 21, 2009, Hutchings, Brad, et al.
Portions of prosecution history of U.S. Appl. No. 11/769,703, Dec. 17, 2008, Hutchings, Brad, et al.
Portions of prosecution history of U.S. Appl. No. 11/769,702, Oct. 8, 2010, Hutchings, Brad.
Portions of prosecution history of U.S. Appl. No. 12/952,177, Feb. 1, 2012, Hutchings, Brad, et al.
Portions of prosecution history of U.S. Appl. No. 11/769,701, Sep. 4, 2009, Hutchings, Brad, et al.
Portions of prosecution history of U.S. Appl. No. 12/637,745, Jun. 1, 2011, Hutchings, Brad, et al.
Portions of prosecution history of U.S. Appl. No. 12/679,305, Sep. 20, 2012, Miller, Marc, et al.
Portions of prosecution history of U.S. Appl. No. 12/728,194, May 17, 2012, Miller, Marc, et al.
Portions of prosecution history of U.S. Appl. No. 12/785,484, Oct. 28, 2011, Fox, Brian.
Portions of prosecution history of U.S. Appl. No. 13/057,477, Aug. 29, 2012, Hutchings, Brad, et al.
Portions of prosecution history of U.S. Appl. No. 13/021,702, Jun. 12, 2012, Hutchings, Brad, et al.
International Search Report for PCT/US2008/061074, Oct. 23, 2008 (mailing date), Tabula, Inc.
Written Opinion for PCT/US2008/061074, Oct. 23, 2008 (mailing date), Tabula, Inc.
International Preliminary Report on Patentability for PCT/US2008/061074, Oct. 26, 2010 (issuance date), Tabula, Inc.
Portions of prosecution history of EP 08746484.8, Feb. 16, 2012, Tabula, Inc.
International Search Report for PCT/US2008/061072, Sep. 15, 2008 (mailing date), Tabula, Inc.
International Preliminary Report on Patentability for PCT/US2008/061072, Jan. 14, 2010 (mailing date), Tabula, Inc.
Written Opinion for PCT/US2008/061072, Jan. 5, 2010 (issuance date), Tabula, Inc.
Portions of prosecution history of EP 08746482.2, Mar. 12, 2012, Tabula, Inc.
International Search Report for PCT/US2008/077141, Dec. 18, 2008 (mailing date), Tabula, Inc.
International Preliminary Report on Patentability for PCT/US2008/077141, Mar. 24, 2010 (issuance date), Tabula, Inc.
Written Opinion for PCT/US2008/077141, Dec. 18, 2008 (mailing date), Tabula, Inc.
International Search Report for PCT/US2008/088492, Mar. 20, 2009 (mailing date), Tabula, Inc.
Written Opinion for PCT/US2008/088492, Mar. 20, 2009 (mailing date), Tabula, Inc.
International Preliminary Report on Patentability for PCT/US2008/088492, Feb. 8, 2011 (issuance date), Tabula, Inc.
International Search Report for PCT/US2010/049198, Nov. 15, 2010 (mailing date), Tabula, Inc.
Written Opinion for PCT/US2010/049198, Nov. 15, 2010 (mailing date), Tabula, Inc.
International Preliminary Report on Patentability for PCT/US2010/049198, Mar. 27, 2012 (issuance date), Tabula, Inc.
Altera Corp., "Section V. In-System Design Debugging," Quartus II Handbook, May 2007, pp. 1-150.
Butts, M., "Future Directions of Dynamically Reprogrammable Systems," IEEE 1995 Custom Integrated Circuits Conference, May 1995, pp. 487-494.
Compton, K., et al., "Reconfigurable Computing: A Survey of Systems and Software," ACM Computing Surveys, Jun. 2002, pp. 171-210, vol. 34, No. 2, ACM, New York, NY.
Graham, P., "Instrumenting Bitstreams for Debugging FPGA Circuits", Proceedings of the 9th Annual IEEE Symposium on Field-Programmable Custom Computing Machines, Apr. 29-May 2, 2001, pp. 41-50, Washington DC.
Graham, P., "Logical Hardware Debuggers for FPGA-Based Systems," A Dissertation Submitted to the Faculty of Brigham Young University in Partial Fulfillment of the Requirements for the Degree of Doctor of Philosophy in Brigham Young University, Dec. 2001, pp. i-246.
Hanono, S., "InnerView Hardware Debugger: A Logic Analysis Tool for the Virtual Wires Emulation System," Submitted to the Department of Electrical Engineering and Computer science in Partial Fulfillment of the Requirements for the Degree of Master of Science at the Massachusetts Institute of Technology, Feb. 1995, pp. 1-59.
Hutchings, B., et al., "Designing and Debugging Custom Computing Applications," IEEE Design & Test of Computers, Jan. 2000, pp. 20-28.
Hutchings, B., et al., "Unifying Simulation and Execution in a Design Environment for FPGA Systems," IEEE Transactions on Very Large Scale Integration (VLSI) Systems, Feb. 2001, pp. 201-205, vol. 9, No. 1.
Luk, W., et al., "Compilation Tools for Run-Time Reconfigurable Designs," FPGAs for Custom Computing Machines, 1997. Proceedings., The 5th Annual IEEE Symposium on FPGA-Based Custom Computing Machines, Apr. 16-18, 1997, pp. 56-65.
Xilinx, Inc., "ChipScope ProSoftware and Cores User Guide," Jan. 10, 2007, pp. 1-206, Xilinx Inc.
Xilinx, Inc., "Virtex-5 FPGA," Configuration User Guide, Feb. 2007, pp. 1-154, Xilinx, Inc.
Updated portions of prosecution history of U.S. Appl. No. 12/870,779, Apr. 4, 2013, Redgrave, Jason, et al.
Updated portions of prosecution history of U.S. Appl. No. 13/281,425, Sep. 23, 2013, Hutchings, Brad, et al.

(56) References Cited

OTHER PUBLICATIONS

Updated portions of prosecution history of U.S. Appl. No. 13/291,087, Mar. 22, 2013, Hutchings, Brad, et al.
Updated portions of prosecution history of U.S. Appl. No. 11/769,683, Nov. 30, 2012, Hutchings, Brad, et al.
Portions of prosecution history of U.S. Appl. No. 13/367,351, Jul. 22, 2013, Hutchings, Brad.
Updated portions of prosecution history of U.S. Appl. No. 12/679,305, Sep. 3, 2013, Miller, Marc, et al.
Updated portions of prosecution history of U.S. Appl. No. 12/728,194, Feb. 1, 2013, Miller, Marc, et al.
Updated portions of prosecution history of U.S. Appl. No. 13/057,477, Aug. 2, 2013, Hutchings, Brad, et al.
Portions of prosecution history of U.S. Appl. No. 13/645,314, Oct. 1, 2013, Hutchings, Brad, et al.
Updated portions of prosecution history of EP08746484.8, May 21, 2013 (mailing date), Tabula, Inc.
Updated portions of prosecution history of EP 08746482.2, May 21, 2013 (mailing date), Tabula, Inc.
U.S. Appl. No. 13/864,507, Apr. 17, 2013, Tabula, Inc.
Updated portions of prosecution history of U.S. Appl. No. 13/281,425, Jan. 15, 2014, Hutchings, Brad, et al.
Updated portions of prosecution history of U.S. Appl. No. 13/367,351, Nov. 7, 2013, Hutchings, Brad.
Updated portions of prosecution history of U.S. Appl. No. 12/679,305, Jan. 22, 2014, Miller, Marc, et al.
Updated portions of prosecution history of U.S. Appl. No. 13/645,314, Jan. 2, 2014, Hutchings, Brad, et al.
Updated portions of prosecution history of EP08746484.8, Nov. 20, 2013 (mailing date), Tabula, Inc.
Updated portions of prosecution history of EP08746482.2, Nov. 27, 2013 (mailing date), Tabula, Inc.
Updated portions of prosecution history of U.S. Appl. No. 13/645,314, Feb. 14, 2014, Hutchings, Brad, et al.

\* cited by examiner

US 8,847,622 B2

MICRO-GRANULAR DELAY TESTING OF CONFIGURABLE ICS

CLAIM OF BENEFIT TO PRIOR APPLICATIONS

This application is a continuation application of presently pending U.S. patent application Ser No. 12/785,484, filed on May 23, 2010 now U.S. Pat. No. 8,072,234, now published as U.S. Publication 2011/0068820. U.S. patent application Ser. No. 12/785,484 claims the benefit of U.S. Provisional Application 61/244,425, entitled "Launch-Capture Testing of Configurable ICs," filed on Sep. 21, 2009. U.S. patent application Ser No. 12/785,484 also claims the benefit of U.S. Provisional Application 61/320,692, entitled "Micro-Granular Delay Testing of Configurable ICs," filed on Apr. 2, 2010. The above-mentioned applications are incorporated herein by reference.

BACKGROUND

Configurable integrated circuits ("ICs") can be used to implement circuit functionality designed by a user ("user design") on an IC without having to fabricate a new IC for each design. One example of a configurable IC is a field programmable gate array ("FPGA"). A configurable IC has several circuits for performing different operations. Configurable circuits can be configured by configuration data to perform a variety of different operations. These circuits can range from logic circuits (e.g., configurable look-up tables, or "LUTs") to interconnect circuits (e.g., configurable multiplexers). The circuits of a configurable IC are often made up of a multitude of transistors, metal and/or polysilicon wires, and/or other elements (e.g., capacitors, resistors, etc.).

During the manufacture of a configurable IC it is possible for flaws to affect the operation of the IC. In addition to flaws, configurable ICs that use minimum width (or near-minimum width) transistors for a particular manufacturing technology are subject to large transistor to transistor variation. These variations can cause individual transistors to operate more slowly than required. In some cases the flaws and/or variations are manifested as malfunctioning circuit elements (e.g., stuck outputs). In other cases, the flaws and/or variations are manifested as substandard performance (e.g., excessive propagation delay). Any slow or non-functioning circuit element may potentially render the configurable IC unusable. Thus, all transistors and wires must be tested on every configurable IC to guarantee that the IC is properly functioning.

Traditional test techniques aggregate the performance of a large number of transistors and wires together into a single measurement. Thus, when some transistors and/or wires are faster than the specified performance limit while a single transistor is slower it is possible for a path that includes the slow transistor to pass the test criteria. This phenomenon is of particular concern in programmable logic because the performance path may be extremely variable (due to the wide variability in end-user designs) and is typically not the same path that is used to test the IC.

Existing IC test methods (e.g., "scan" testing that uses automatic test pattern generation or "ATPG") measure performance by propagating a single edge through the circuit under test. In contrast, when operating in user mode, a configurable IC will have multiple operational paths and/or circuits, typically operating at a high switching rate (measured in MHz or GHz). When running at a high switching rate, the power supply to the transistors in the IC will be stressed, the temperature of the circuit will be elevated, and the on-chip decoupling capacitors will be charging and discharging. The effect of these stresses on the performance of the IC is not fully measured using traditional IC test methods.

BRIEF DESCRIPTION OF THE DRAWINGS

The novel features of the invention are set forth in the appended claims. However, for purpose of explanation, several embodiments of the invention are set forth in the following figures.

BRIEF SUMMARY

Figure 1:
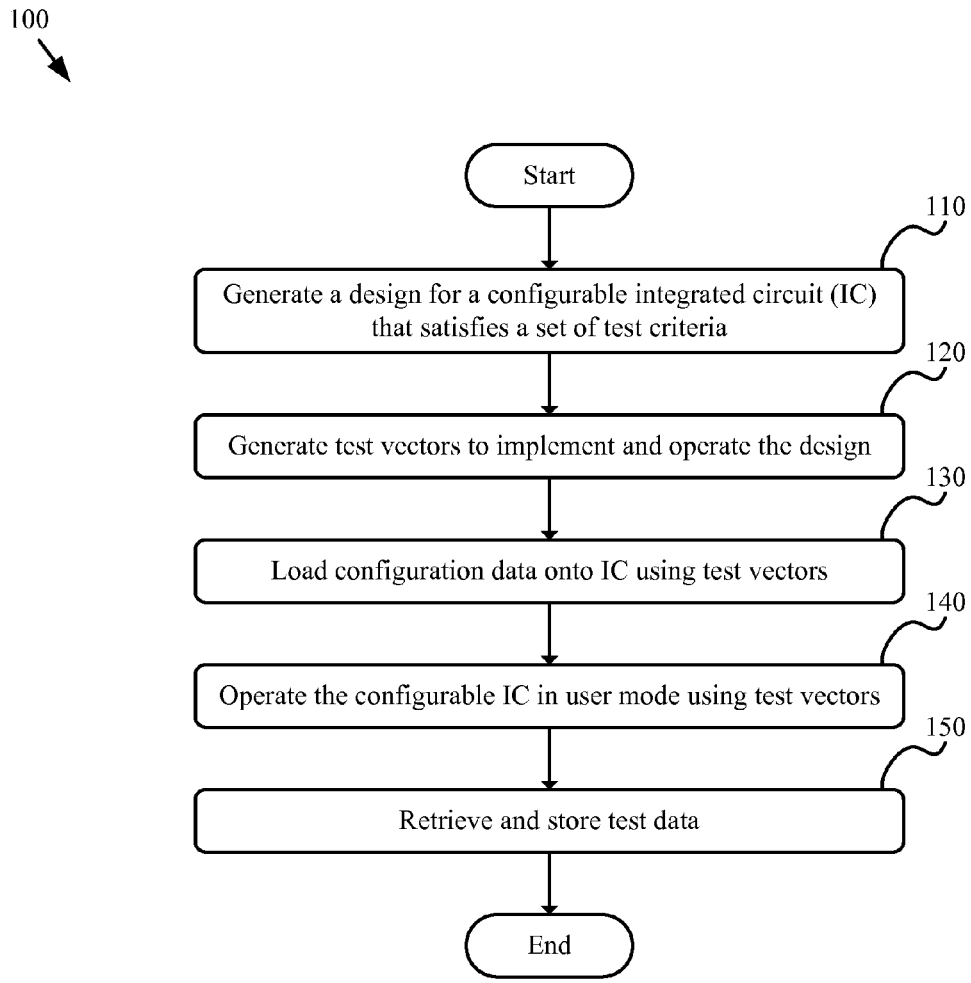
FIG. 1 illustrates a conceptual process used by some embodiments to perform launch-capture testing of a configurable IC.

A method of testing a configurable integrated circuit ("IC") is provided by some embodiments. Such configurable ICs may have a primary circuit structure including configurable logic circuits for configurably performing logic functions, a configurable routing fabric for configurably connecting the circuits of the IC, and/or configurable storage elements placed throughout the configurable routing fabric for configurably storing signals passed along the routing fabric. In addition these configurable ICs may have a secondary circuit structure including a configuration/debug network (alternatively referred to as a "configuration network" or "debug network") for configuring the configurable circuits of the IC, where the configurable storage elements and/or other circuit elements are accessible through the configuration network.

In such an environment, the configurable storage elements provide plentiful configurable "capture" elements that are able to store data at various points along a test path, thus breaking a long signal path into multiple smaller paths and allowing micro-granular testing of signal-path delay. The data stored by the capture elements may be read out using the configuration/debug network in order to verify the operation of the IC.

In addition to such capture elements, several configurable logic circuits (and/or other circuits) provide a number of "launch" elements that are able to generate test stimulus, where the stimulus is provided to various circuitry under test. In addition to the launch and capture elements, various other circuitry of the IC (e.g., configurable routing circuits) provide a set of configurable test paths that connect launch elements and capture elements during test.

The test method (1) loads configuration data to the configurable circuits to specify the desired operation of the configurable circuits during test, (2) configures the configuration/debug network to allow access to the desired test points (e.g., capture elements) within the IC, (3) operates the IC in "user" mode to exercise the circuitry (i.e., operated as in a final application after configuring the IC to perform functionality specified by a user design), and (4) reads the data in the storage elements to verify the operation of the circuitry under test. In this manner, the method allows a large number of shorter paths to be tested in parallel while operating under realistic final application conditions.

The primary circuit structure of the configurable IC under test may include, in addition to circuitry such as the configurable logic and routing circuits mentioned above, configurable input/output circuitry, and configuration data storage elements for storing configuration data that controls the operation of the various configurable circuits of the IC. The configuration/debug network may include various configurable and/or non-configurable circuitry (e.g., logic circuits, storage circuits, routing circuits, etc.).

The configuration/debug network may be used to write configuration data to the configuration data storage elements in order to control the operation of the elements included in the primary circuit structure. The primary circuit structure may thus be used to create a set of configurable test stimulus generators (alternatively referred to as "launch elements", "launch circuits", or "launch sources"). The test stimuli can be generated by logic elements, routing elements, etc. The operation of such test stimulus generators may be defined by configuration data loaded onto the IC using the configuration/debug network.

The configuration data loaded onto the IC may also be used to control a set of controllable storage elements that are used to store the response of the circuitry to the test stimuli (such controllable storage elements are referred to as "capture elements", "capture circuits", or "capture devices"). Configuration data may also be loaded onto the IC in order to provide a set of test paths that span between the test stimulus generators and the storage elements. Such a test method is referred to as "launch-capture" testing.

In addition to configuring the various elements of the primary circuit structure, the configuration data loaded onto the IC may be used to configure the configuration/debug network to access the configurable storage elements placed within the configurable routing fabric. The configuration/debug network may also be configured to monitor the operation of the primary circuit structure and/or perform other operations In some embodiments, the capture elements are observable as memory-mapped resources accessed via a bus. Such a bus may be included in (or accessed using) the configuration/debug network in some embodiments. The accessibility of these observation nodes is limited by the address decode of the bus logic, not by the connection of observation nodes to external device IOs (e.g., I/O pads, I/O pins, etc.). This allows a very large number of observation nodes to be tested on a particular IC without requiring a large number of test pads or pins. In addition, the bus logic allows multiple capture nodes to be verified simultaneously.

After configuring the primary circuit structure and the configuration/debug network, the IC is placed in user mode and a clock signal is supplied to the IC. The IC is then operated using the configuration data previously loaded onto the IC.

To more accurately measure the performance of the shorter test paths, some embodiments operate the IC using a sub-cycle operating scheme, whereby multiple operational sub-cycles (e.g., four, eight, etc.) occur during each user design cycle. By testing the IC using sub-cycle operation, signal paths that have delays that are fractions of a user design cycle may be used. In addition to testing the circuitry using a sub-cycle operating scheme, some embodiments vary the clock frequency or utilize multiple phase-shifted clock signals in order to further reduce the minimum testable duration.

Some embodiments use a single clock source when operating the IC in user mode. The single clock source is used for the test stimulus generators, the test paths, and the storage elements. The minimum delay that can be measured in these embodiments is $1/f_{CLK}$ (i.e., the minimum measurable delay is defined by a single clock or operation cycle). Thus, for example, with a 1.6 GHz clock source delays as short as 625 ps can be measured.

For greater accuracy when using a single clock source, some embodiments vary the clock frequency on successive tests (e.g., a test may fail at 1.6 GHz but pass at 1.575 GHz). The resolution of such testing is limited by the control accuracy of the clock generator circuits, which can be 20 ps or smaller. Achieving such improved resolution requires additional test time due to requiring multiple test passes, adjusting the clock generator circuits, etc.

In order to avoid adjusting the clock frequency during test, some embodiments use multiple clock domains that have a controllable phase relationship. A first clock domain may be used for the launch element. A second clock domain may be used for the capture element. By varying the phase delay of the second clock domain with respect to the first clock domain, the delay of the circuit can be measured in smaller increments than when using a single clock source. The minimum measurable delay is determined by the size of the phase delay. In a typical implementation this delay can be 70 ps or smaller. As above, the ultimate resolution is limited by the control of the clock phase controller employed by the clock generator circuits.

After operating the IC in user mode, the operation is stopped (e.g., by disabling the clock signal) and the test results are read out from the capture elements. The values may be read using the configuration/debug network. The values may then be used to verify the performance of the IC and/or stored for further analysis.

Some embodiments allow more precise measurement of power supply variation within an IC. The use of launch-capture testing allows many delay measurements (e.g., >100,000) to be taken simultaneously within a single IC. Because very fine resolution delay measurements may be made at a very large number of locations on the IC, some embodiments may identify a group of circuits under test that have increased delay. Thus, the locations of high resistance metal supply connections may be identified. By analyzing the amount of change in the delay with respect to the typical value the resistance of the metal can be determined.

Measurement of temperature variation within an IC may also be more accurately measured using launch-capture testing. The temperature of the die can be uneven due to flaws in assembly and/or other factors. High temperatures cause circuits in the area to have increased delay. By identifying a group of circuits under test that have increased delay, the location of high temperature areas of the IC can be identified. By analyzing the amount of change in the delay with respect to the typical value, the temperature of each area of the IC can be determined.

Measurement of clock skew within an IC is another parameter that may be more accurately measured using launch-capture testing. Various circuits of the IC may be programmed to be driven by different clock sources. The different clock sources will have varying amounts of clock skew. Comparing delay measurements taken using different clock sources allows the skew of the clock sources to be determined.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawing, but rather are to be defined by the appended claims, because the claimed subject matters can be embodied in other specific forms without departing from the spirit of the subject matters.

DETAILED DESCRIPTION

In the following description, numerous details are set forth for purpose of explanation. However, one of ordinary skill in the art will realize that the invention may be practiced without the use of these specific details. For instance, well-known structures and devices are shown in block diagram form in order not to obscure the description of the invention with unnecessary detail.

A method of testing a configurable integrated circuit ("IC") is provided by some embodiments. Such configurable ICs may have a primary circuit structure including configurable logic circuits for configurably performing logic functions, a configurable routing fabric for configurably connecting the circuits of the IC, and/or configurable storage elements placed throughout the configurable routing fabric for configurably storing signals passed along the routing fabric. In addition these configurable ICs may have a secondary circuit structure including a configuration/debug network (alternatively referred to as a "configuration network" or "debug network") for configuring the configurable circuits of the IC, where the configurable storage elements and/or other circuit elements are accessible through the configuration network.

In such an environment, the configurable storage elements provide plentiful configurable "capture" elements that are able to store data at various points along a test path, thus breaking a long signal path into multiple smaller paths and allowing micro-granular testing of signal-path delay. The data stored by the capture elements may be read out using the configuration/debug network in order to verify the operation of the IC.

In addition to such capture elements, several configurable logic circuits (and/or other circuits) provide a number of "launch" elements that are able to generate test stimulus, where the stimulus is provided to various circuitry under test. In addition to the launch and capture elements, various other circuitry of the IC (e.g., configurable routing circuits) provide a set of configurable test paths that connect launch elements and capture elements during test.

The test method (1) loads configuration data to the configurable circuits to specify the desired operation of the configurable circuits during test, (2) configures the configuration/debug network to allow access to the desired test points (e.g., capture elements) within the IC, (3) operates the IC in "user" mode to exercise the circuitry (i.e., operated as in a final application after configuring the IC to perform functionality specified by a user design), and (4) reads the data in the storage elements to verify the operation of the circuitry under test. In this manner, the method allows a large number of shorter paths to be tested in parallel while operating under realistic final application conditions.

FIG. 1 illustrates a conceptual process 100 used by some embodiments to perform launch-capture testing of a configurable IC. The process will be described with reference to FIG. 2, which conceptually represents a portion of circuitry in a configurable IC under test. As shown, the process generates (at 110) a design for a configurable IC such that the design satisfies a set of test criteria. The test criteria for the IC may be based on verification of operational limits (e.g., propagation delay of a set of circuits, logical functionality, etc.), failure analysis (FA) of a section of circuitry of an IC, characterization of IC performance (e.g., performance over temperature, supply voltage, and process variations, etc.), or any other desired evaluation of the IC. Before describing the test methodology in more detail, an example configurable IC architecture will be described.

Figure 2:
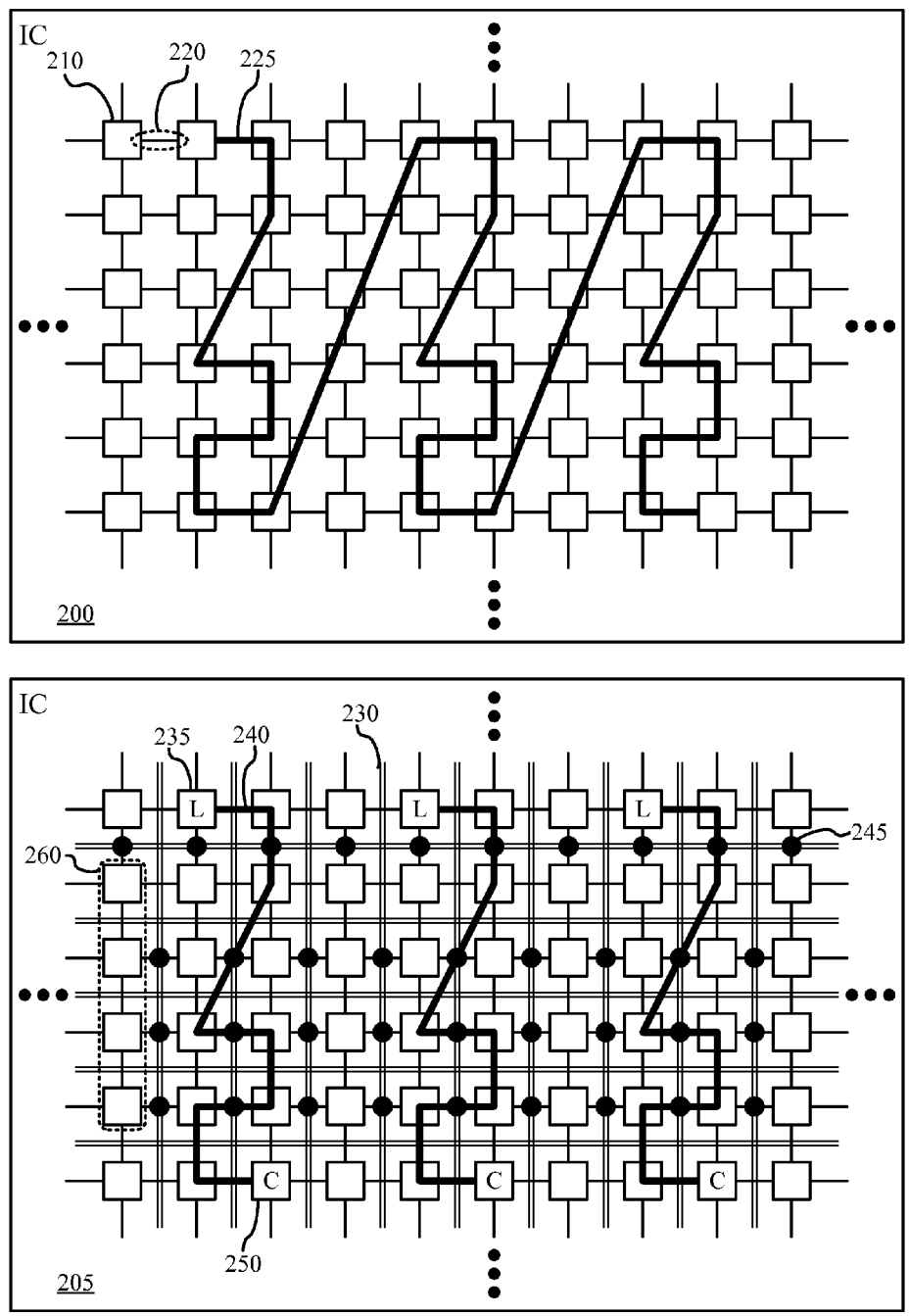
FIG. 2 conceptually illustrates a configurable IC, tested by some embodiments, that includes numerous configurable circuits and numerous connections among the circuits.

FIG. 2 conceptually illustrates such a configurable IC architecture configured with a first test design 200 and a second test design 205. The first test design 200 is implemented using the primary circuit structure of the IC. The IC of FIG. 2 includes numerous configurable circuits 210 and numerous configurable connections 220 among the circuits. In this example, the circuits 210 and connections 220 are part of the primary circuit structure. However, the configuration/debug network may also be represented in a similar way. The primary circuit structure of the configurable IC under test may include, in addition to circuitry such as the configurable logic and routing circuits (circuits 210 and 220 mentioned above), configurable input/output circuitry, and configuration data storage elements for storing configuration data that controls the operation of the various configurable circuits of the IC.

The second test design 205 is implemented using the configuration/debug network in addition to the primary circuit structure of the IC. In this example, the configuration/debug network is represented as a set of communication pathways 230. However, the configuration/debug network may include various other configurable and/or non-configurable circuitry (e.g., logic circuits, storage circuits, routing circuits, etc.). Furthermore, the second test design 205 illustrates numerous configurable storage elements 245 located throughout the IC.

The configuration/debug network 230 may be used to write configuration data to the configuration data storage elements in order to control the operation of the elements included in the primary circuit structure. The primary circuit structure may thus be used to create a set of configurable test stimulus generators (alternatively referred to as "launch elements", "launch circuits", or "launch sources"). The test stimuli can be generated by logic elements, routing elements, etc. The operation of such test stimulus generators may be defined by configuration data loaded onto the IC using the configuration/debug network.

The configuration data loaded onto the IC may also be used to control a set of controllable storage elements (e.g., elements 245) that are used to store the response of the circuitry to the test stimuli (such controllable storage elements are referred to as "capture elements", "capture circuits", or "capture devices"). Configuration data may also be loaded onto the IC in order to provide a set of test paths that span between the test stimulus generators and the storage elements. Such a test method is referred to as "launch-capture" testing.

In addition to configuring the various elements of the primary circuit structure, the configuration data loaded onto the IC may be used to configure the configuration/debug network to access the configurable storage elements placed within the configurable routing fabric. The configuration/debug network may also be configured to monitor the operation of the primary circuit structure and/or perform other operations.

In some embodiments, the capture elements are observable as memory-mapped resources accessed via a bus. Such a bus may be included in (or accessed using) the configuration/debug network in some embodiments. The accessibility of these observation nodes is limited by the address decode of the bus logic, not by the connection of observation nodes to external device IOs (e.g., I/O pads, I/O pins, etc.). This allows a very large number of observation nodes to be tested on a particular IC without requiring a large number of test pads or pins.

In addition, the bus logic allows multiple capture nodes to be verified simultaneously. In some ICs, multiple elements send data to the debug network at the same time. Such ICs may have mask and merge registers to filter out data from elements that are not being monitored. A more detailed explanation of such merge and mask registers is provided in U.S. patent application Ser. No. 11/375,562, entitled "Accessing Multiple User States Concurrently in a Configurable IC," filed on Mar. 13, 2006, issued as U.S. Pat. No. 7,788,478, which is incorporated herein by reference.

The first and second test designs 200 and 205 shown in FIG. 2 illustrate the use of storage elements placed along a test path and used in conjunctions with the configuration/debug network to test the configurable IC. In the first test design 200, a long string 225 of individual elements 210 is tested at once, as in a typical scan-chain test implementation. By combining a large number of elements in a single test path, a greater amount of test coverage is achieved, but test resolution and the ability to isolate elements are sacrificed. In addition, the test path 225 may be pre-defined, and thus non-configurable during test (i.e., the path may not be able to be modified in real-time based on test results).

In the second test design 205, multiple test paths are defined using launch-capture testing. The second test design 205 shows multiple launch elements 235 that provide stimuli that traverse defined routes 240 before reaching multiple capture elements 250. In this example, the test paths 240 are sections of the test path 225 used in the first test design 200. In the second design, various storage elements 245 are available throughout the routing fabric of the configurable IC. As described above, these storage elements may be accessed using the configuration/debug network 230.

Different embodiments may generate test designs in different ways. In some embodiments, the circuitry of the configurable IC is generated using electronic design automation (EDA). Some of these embodiments may use a hardware description language (HDL) (e.g., Verilog) to provide a software description of the circuitry included in the IC. In some of these embodiments, the HDL code is automatically examined (e.g., by a tool command language ("TCL") script) to determine a set of routes that satisfy the test criteria (e.g., propagation delay for a set of circuitry). In some embodiments, the routes may be manually generated and/or automatically generated based on other data instead of or in conjunction with the analysis of any HDL code.

The routes may be stepped and repeated across an IC that has a repeating pattern of circuits such that many devices are evaluated during a single test. FIG. 2 shows one example design 205 where a route 240 is stepped across multiple locations of the IC. Although in this example, the route is stepped in a horizontal direction, the route could also be stepped vertically, or at an angle. In addition, the routes could be stepped using a combination of horizontal, vertical, and/or angular movements. In addition to generating the routes, some embodiments define monitor circuitry to store the state of the IC at the end of the test cycle, and/or other test circuitry. FIG. 2 shows a set of circuits 260 that are not being used as launch, capture, or routing circuits, and thus may be used to define the monitor circuitry and/or other test circuitry in example design 205.

Returning to FIG. 1, after generating (at 110) the design, which includes the routes and monitor circuitry, the process generates (at 120) test vectors to implement and operate the design. The test vectors include a set of defined logical states and properties for various signals. In some embodiments, the test vectors include configuration data (and control signals for loading the configuration data, clock signals, etc.), operational data (e.g., clock signals, control signals, etc.), and/or capture commands (i.e., data read operations). These test vectors may be supplied to a set of test hardware that, in turn, supplies the appropriate electrical signals to the IC being tested.

Next, the process loads (at 130) configuration data onto the configurable IC using the generated test vectors. This configuration data defines the operation of the configurable IC such that the routes, monitor circuitry, and/or other test circuitry are implemented using the configurable circuits and routing fabric of the IC. The configuration data is loaded onto configuration data storage elements, which are connected to the various configurable circuits of the IC. The configuration data may be loaded by using automated test equipment to execute the appropriate test vectors.

The process then operates (at 140) the configurable IC in user mode using the generated test vectors. When in user mode, the IC may perform various logic and routing operations based on the loaded configuration data and various control signals (e.g., a clock signal, a reset signal, etc.). As above, the configuration data and various control signals may be provided using automated test equipment to execute the appropriate test vectors.

In the context of launch-capture testing, operation of the IC in user mode causes a set of launch elements (e.g., launch elements 235) to generate output data that changes in a particular operation cycle. Each output signal then traverses a path under test (e.g., path 240) until arriving at the capture element (e.g., capture element 250) associated with the launch element producing the output signal. In some embodiments, multiple capture elements may be associated with a single launch element (i.e., multiple capture elements placed along a launch-capture path may be used to capture data at various points along the path, where all the capture data is based on a single stimulus element).

To more accurately measure the performance of the shorter test paths 240, some embodiments operate the IC using a sub-cycle operating scheme, whereby multiple operational sub-cycles (e.g., four, eight, etc.) occur during each user design cycle. By testing the IC using sub-cycle operation, signal paths that have delays that are fractions of a user design cycle may be evaluated. In addition to testing the circuitry using a sub-cycle operating scheme, some embodiments vary the clock frequency or utilize multiple phase-shifted clock signals in order to further reduce the minimum testable duration.

Some embodiments use a single clock source when operating the IC in user mode. The single clock source is used for the test stimulus generators, the test paths, and the storage elements. The minimum delay that can be measured in these embodiments is $1/f_{CLK}$ (i.e., the minimum measurable delay is defined by a single clock or operation cycle). Thus, for example, with a 1.6 GHz clock source delays as short as 625 ps can be measured.

For greater accuracy when using a single clock source, some embodiments vary the clock frequency on successive tests (e.g., a test may fail at 1.6 GHz but pass at 1.575 GHz). The resolution of such testing is limited by the control accuracy of the clock generator circuits, which can be 20 ps or smaller. Achieving such improved resolution requires additional test time due to requiring multiple test passes, adjusting the clock generator circuits, etc.

In order to avoid adjusting the clock frequency during test, some embodiments use multiple clock domains that have a controllable phase relationship. A first clock domain may be used for the launch element. A second clock domain may be used for the capture element. By varying the phase delay of the second clock domain with respect to the first clock domain, the delay of the circuit can be measured in smaller increments than when using a single clock source. The minimum measurable delay is determined by the size of the phase delay. In a typical implementation this delay can be 70 ps or smaller. As above, the ultimate resolution is limited by the control of the clock phase controller employed by the clock generator circuits.

After operating the IC in user mode, the operation is stopped (e.g., by disabling the clock signal) and the test results are read out from the capture elements. The values may be read using the configuration/debug network. The values may then be used to verify the performance of the IC and/or stored for further analysis.

Returning to FIG. 1, process 100 then retrieves and stores (at 150) the test data from the capture elements (e.g., capture elements 250 and/or storage elements 245). In some embodiments, the test data may include the logic state of each capture element. As above, the retrieval of test data may be performed using automated test equipment to execute the appropriate test vectors. In addition, some embodiments store data that indicates which path was used to generate the test data that is stored in a particular capture element.

Other information may be retrieved and stored with the test data (e.g., temperature, supply voltage, data identifying the source of the device under test, etc.). The test data may be stored in a single file or across multiple files. The data may be stored locally on a particular test system, stored in a database on a central server, or some other appropriate location. After storing the test data, process 100 ends.

Some embodiments allow more precise measurement of power supply variation within an IC. The use of launch-capture testing allows many delay measurements (e.g., >100,000) to be taken simultaneously within a single IC. Because very fine resolution delay measurements may be made at a very large number of locations on the IC, some embodiments may identify a group of circuits under test that have increased delay. Thus, the locations of high resistance metal supply connections may be identified. By analyzing the amount of change in the delay with respect to the typical value the resistance of the metal can be determined.

Measurement of temperature variation within an IC may also be more accurately measured using launch-capture testing. The temperature of the die can be uneven due to flaws in assembly and/or other factors. High temperatures cause circuits in the area to have increased delay. By identifying a group of circuits under test that have increased delay, the location of high temperature areas of the IC can be identified. By analyzing the amount of change in the delay with respect to the typical value, the temperature of each area of the IC can be determined.

Measurement of clock skew within an IC is another parameter that may be more accurately measured using launch-capture testing. Various circuits of the IC may be programmed to be driven by different clock sources. The different clock sources will have varying amounts of clock skew. Comparing delay measurements taken using different clock sources allows the skew of the clock sources to be determined.

One of ordinary skill in the art will recognize that process 100 is a conceptual representation of the operations used to perform launch-capture testing. The specific operations of the process may not be performed in the exact order described or different specific operations may be performed in different embodiments. Also, the process may not be performed as one continuous series of operations. For instance, operations 110 and 120 may be performed during test development, while operations 130-150 may be performed during testing itself. Furthermore, the process could be implemented using several sub-processes, or as part of a larger macro-process.

Many of the examples given above and below are conceptual examples and are not meant to fully define or limit the environment in which some embodiments of the invention operate. For instance, many examples will use specific bit counts, numbers of circuits, numbers of I/Os, etc., but different embodiments may be implemented with different specific numbers of such resources (or with the resources arranged in different ways). In addition, many examples omit various connections or signals for clarity. For instance, many examples may omit clock signals, control signals, connection paths between circuits, etc. Furthermore, the labels or accompanying description may indicate that a set of signals has a particular source (e.g., configuration data) but different embodiments may supply the signals from alternative sources (e.g., control signals).

Several more detailed embodiments of the invention are described in the sections below. Section I provides a description of the test environment used to implement launch-capture testing. Next, Section II describes the launch-capture test methodology used by some embodiments at test time. Section III describes various circuits and processes used by some embodiments to isolate faults identified during launch-capture testing. Section IV then describes the generation of test vectors used to implement launch-capture testing. Lastly, Section V describes a computer system which implements some of the embodiments of the invention.

I. Test Environment

Typically, IC testing is performed using automated test equipment to provide power supply and signal stimulus to a device under test. Such testing may rely on various hardware and/or software resources. Sub-section I.A describes the IC architecture of devices that are tested by some embodiments. Sub-section I.B then describes the operation of a configurable IC, as utilized by some embodiments to perform test functions. Sub-section I.C then describes a conceptual test system used by some embodiments to perform the testing of ICs.

A. IC Architecture

Figure 3A:
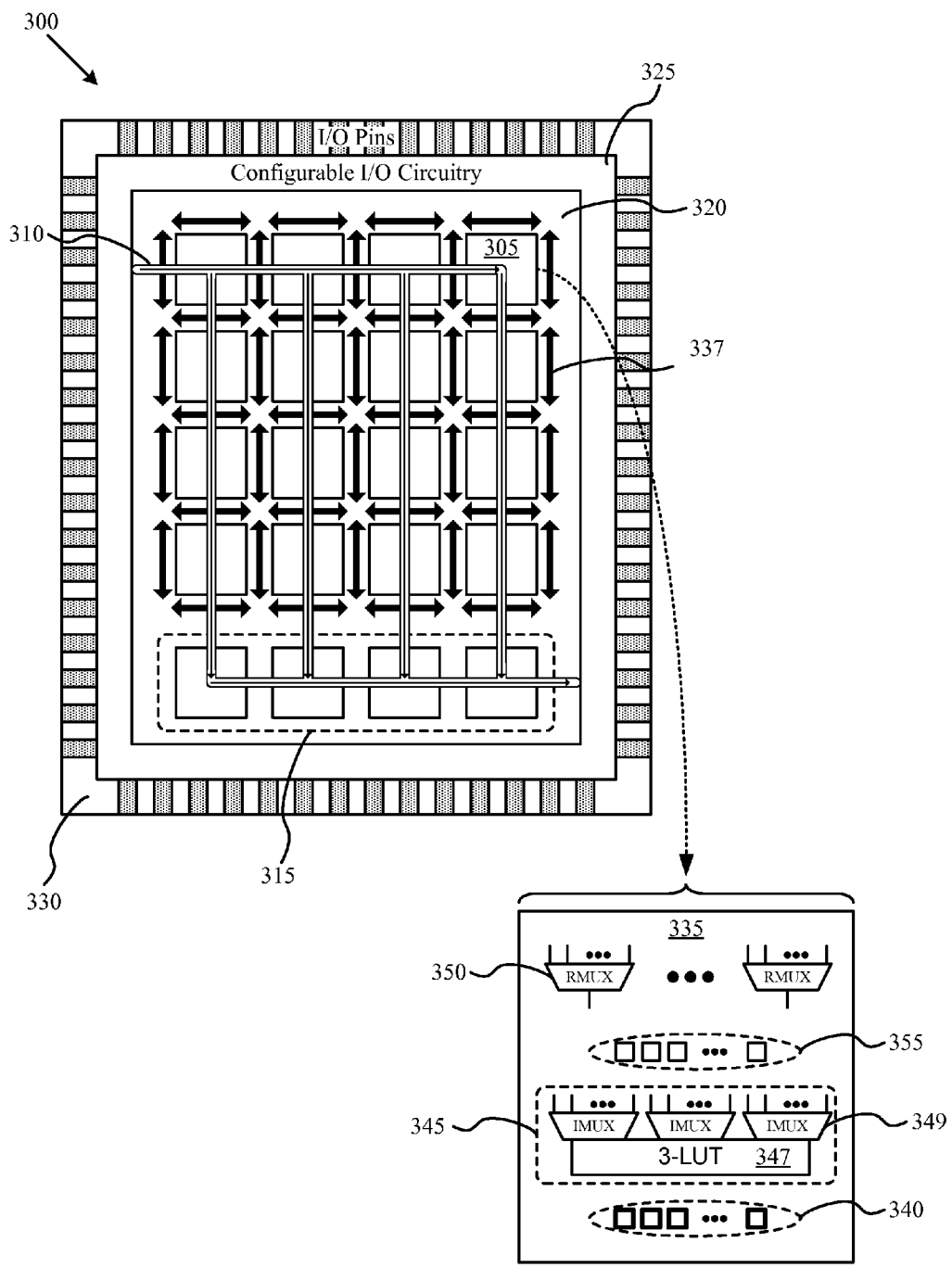
FIG. 3A conceptually illustrates an example of a configurable IC, tested by some embodiments, that includes numerous configurable circuits.
Figure 3B:
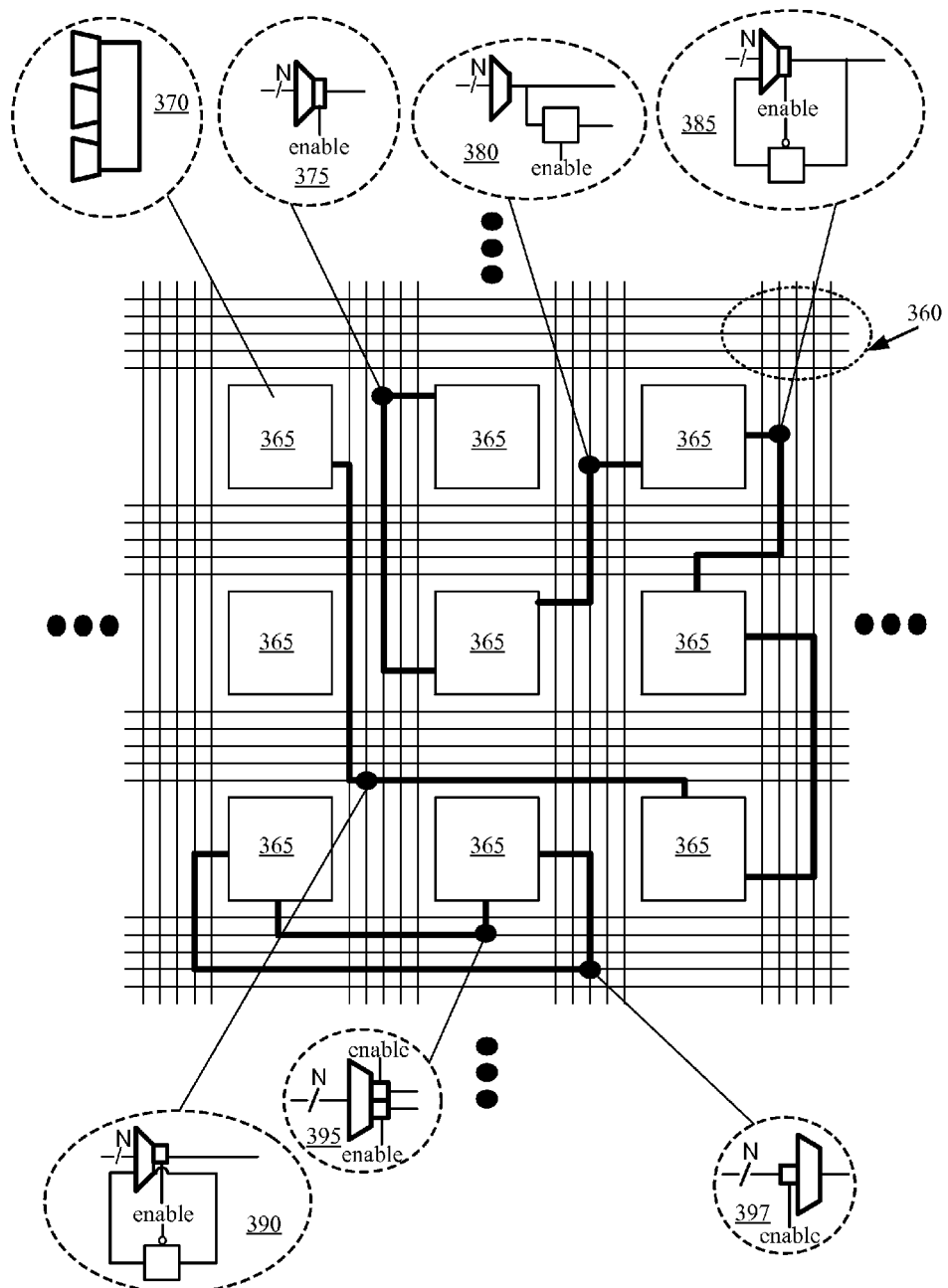
FIG. 3B illustrates several examples of different types of configurable storage elements that can be located throughout the routing fabric of a configurable IC.

FIGS. 3A-3B conceptually illustrate an example of a configurable IC 300 that includes numerous configurable circuits. FIG. 3A shows a conceptual circuit arrangement for a configurable IC while FIG. 3B shows several types of configurable storage elements that may be placed throughout the routing fabric of the IC. In the example IC shown in FIG. 3A, the configurable circuits of the primary circuit structure are arranged as sets of circuit elements 305 and a configuration/debug network that includes an alternative communication pathway 310 within the IC and a transport network 315 for passing data from the alternative communication pathway.

The primary circuit structure includes an array of sets of circuits (or "tiles") 305, a routing fabric 320 formed by elements of the tiles and/or other circuitry, and configurable I/O circuitry 325 for connecting the primary circuit structure and/or configuration/debug network to a set of I/O pins 330 for passing signals to and from the IC. Although represented as pins, the I/O pins 330 could be pads (e.g., when probing an IC in wafer or die form), solder bumps, and/or other types of connections.

In this example, the tiles 305 are arranged in an array of several aligned rows and columns. Within or outside such a circuit array, some embodiments disperse other circuits (e.g., memory blocks, processors, macro blocks, intellectual property ("IP") blocks, serializer/deserializer ("SERDES") controllers, clock management units, etc.). Each tile 305, as shown in breakout section 335, may include sets of configuration data storage elements 340 for storing configuration data (e.g., a set of SRAM cells) associated with each of the configurable circuits of the IC, configurable logic circuits 345 (e.g., look-up tables (LUTs) 347, input multiplexers (IMUXs) 349, etc.) for configurably performing logic operations, configurable routing circuits 350 for configurably routing signals, and/or sets of configurable storage elements 355 for configurably storing signals passed between the various circuits of the IC. Different embodiments (or different tiles in some embodiments) have different numbers of each type of circuit.

Sections of the tiles (e.g., the routing circuits 350, and/or configurable storage elements 355, etc.) form the configurable routing fabric 320, which is conceptually represented as a set of pathways 337 between the tiles 305. The configurable routing fabric may also connect circuitry within individual tiles, among sets of tiles, between the tiles and the configurable I/O circuitry 325, and/or to other circuits of the IC. The configurable routing fabric 320 may also include various wires, buffers, resistors, capacitors, and/or other circuitry.

A routing multiplexer ("RMUX") 350 is an example of a configurable routing circuit that at a macro level connects other circuits of the IC. The RMUX includes multiple inputs, one of which is passed to the output of the RMUX based on signals passed to a set of select lines. The select lines may be controlled by configuration data, input data, and/or other data. Unlike an IMUX that only provides its output to a single logic circuit (i.e., that only has a fan out of 1), a routing multiplexer in some embodiments may provide its output to several logic, routing, and/or other circuits (i.e., has a fan out greater than 1).

The configurable storage elements 355 are examples of configurable storage circuitry distributed throughout the IC. Different types of storage elements may include different numbers of inputs and/or different numbers of outputs. In addition, different storage elements may be controlled by different types of signals (e.g., level-sensitive storage elements, edge-triggered storage elements, etc.). Furthermore, different storage elements may include various circuitry (e.g., latches, multiplexers, switches, etc.). The storage elements may be accessible through the configuration/debug network 310. A more detailed explanation of such storage elements is provided in PCT Application PCT/US09/33840, entitled "Controllable Storage Elements for an IC," filed on Feb. 11, 2009, which is incorporated herein by reference.

In some embodiments, the logic circuits are look-up tables while the routing circuits (alternatively referred to as "interconnect circuits") are multiplexers. Also, in some embodiments, the LUTs and the multiplexers are sub-cycle reconfigurable circuits (sub-cycles of reconfigurable circuits may be alternatively referred to as "reconfiguration cycles"). Reconfigurable IC operation will be described in more detail in sub-section I.B below. In some of these embodiments, the configurable IC stores multiple sets of configuration data for a sub-cycle reconfigurable circuit, so that the reconfigurable circuit can use a different set of configuration data in different sub-cycles. Other configurable tiles can include other types of circuits, such as memory arrays instead of logic circuits.

An IMUX 349 is an interconnect circuit associated with the LUT 347 that may be in the same tile as the IMUX. Each such IMUX receives several input signals for the associated LUT and passes one of these input signals to the associated LUT based on the signals supplied to a set of select lines. Various wiring architectures can be used to connect the RMUXs, IMUXs, and LUTs.

The secondary circuit structure includes the alternative communication pathway 310, which may be used to route configuration data to the tiles. Some ICs include a configuration controller for providing configuration data to the alternative communication pathway. Some embodiments use a packet switching technology to route data to and from the resources in the configurable tiles. Hence, over the pathway 310, these embodiments can route variable length data packets to each configurable tile in a sequential or random access manner.

In addition, the pathway 310 may be used to route other data among the tiles and/or other circuits of the IC. For instance, the pathway may pass debug data to transport network 315, which in turn passes the debug data on to other components (not shown). A more detailed explanation of such a transport network is provided in U.S. patent application Ser. No. 11/769,680, entitled "Translating a User Design in a Configurable IC for Debugging the User Design," filed on Jun. 27, 2007, issued as U.S. Pat. No. 8,069,425, which is incorporated herein by reference.

The secondary circuit structure may also include configurable circuits such as logic circuits, storage elements, etc. The secondary circuit structure may also be used to monitor the primary circuit structure, perform logical operations, etc. In some ICs, the secondary circuit structure may be arranged in an array of tiles, or some other appropriate arrangement. Some ICs may include more than two circuit structures.

In some embodiments, the examples illustrated in FIG. 3A represent the actual physical architecture of a configurable IC. However, in other embodiments, the examples illustrated in FIG. 3A topologically illustrate the architecture of a configurable IC (i.e., they conceptually show the configurable IC without specifying a particular geometric layout for the position of the circuits). In some embodiments, the position and orientation of the circuits in the actual physical architecture of a configurable IC are different from the position and orientation of the circuits in the topological architecture of the configurable IC. Accordingly, in these embodiments, the IC's physical architecture appears quite different from its topological architecture.

Some embodiments might organize the configurable circuits in an arrangement that does not have all the circuits organized in an array with several aligned rows and columns. Therefore, some arrangements may have configurable circuits arranged in one or more arrays, while other arrangements may not have the configurable circuits arranged in an array. Some embodiments might utilize alternative tile structures and/or communication pathways. In addition, some embodiments may test various different IC architectures. For example, some ICs may include multiple dice in one package (i.e., a system-in-a-package implementation). As another example, some embodiments may employ a system-on-a-chip design whereby various functional (and/or physical) elements are manufactured as separate modules on a single substrate.

FIG. 3B illustrates several examples of different types of configurable storage elements 375-997 that can be located throughout the routing fabric 360 of a configurable IC. Each storage element 375-397 can be controllably enabled to store an output signal from a source component that is to be routed through the routing fabric to some destination component. In some embodiments, some or all of these storage elements are configurable storage elements whose storage operation is controlled by a set of configuration data stored in configuration data storage of the IC. U.S. patent application Ser. No. 11/081,859, issued as U.S. Pat. No. 7,342,415, describes a two-tiered multiplexer structure for retrieving enable signals on a sub-cycle basis from configuration data storage for a particular configurable storage. It also describes building the first tier of such multiplexers within the output circuitry of the configuration storage that stores a set of configuration data. Such multiplexer circuitry can be used in conjunction with the configurable storage elements described above and below. U.S. patent application Ser. No. 11/081,859, issued as U.S. Pat. No. 7,342,415, is incorporated herein by reference.

As illustrated in FIG. 3B, outputs are generated from the circuit elements 365. The circuit elements 365 are configurable logic circuits (e.g., 3-input LUTs and their associated IMUXs as shown in expansion 370), while they are other types of circuits in other embodiments. In some embodiments, the outputs from the circuit elements 365 are routed through the routing fabric 360 where the outputs can be controllably stored within the storage elements 375-397 of the routing fabric. Storage element 375 is a storage element that is coupled to the output of a routing multiplexer. Storage element 380 includes a routing circuit with a parallel distributed output path in which one of the parallel distributed paths includes a storage element. Storage elements 385 and 390 include a routing circuit with a set of storage elements in which a second storage element is connected in series or in parallel to the output path of the routing circuit. Storage element 395 has multiple storage elements coupled to the output of a routing multiplexer. Storage element 397 is a storage element that is coupled to the input of a routing multiplexer.

One of ordinary skill in the art will realize that the depicted storage elements within the routing fabric sections of FIG. 3B only present some embodiments of the invention and do not include all possible variations. Some embodiments use all these types of storage elements, while other embodiments do not use all these types of storage elements (e.g., some embodiments use only one or two of these types of storage elements). Some embodiments may place the storage elements at locations other than the routing fabric (e.g., between or adjacent to the configurable logic circuits within the configurable tiles of the IC).

B. Configurable IC Operation

Figure 4:
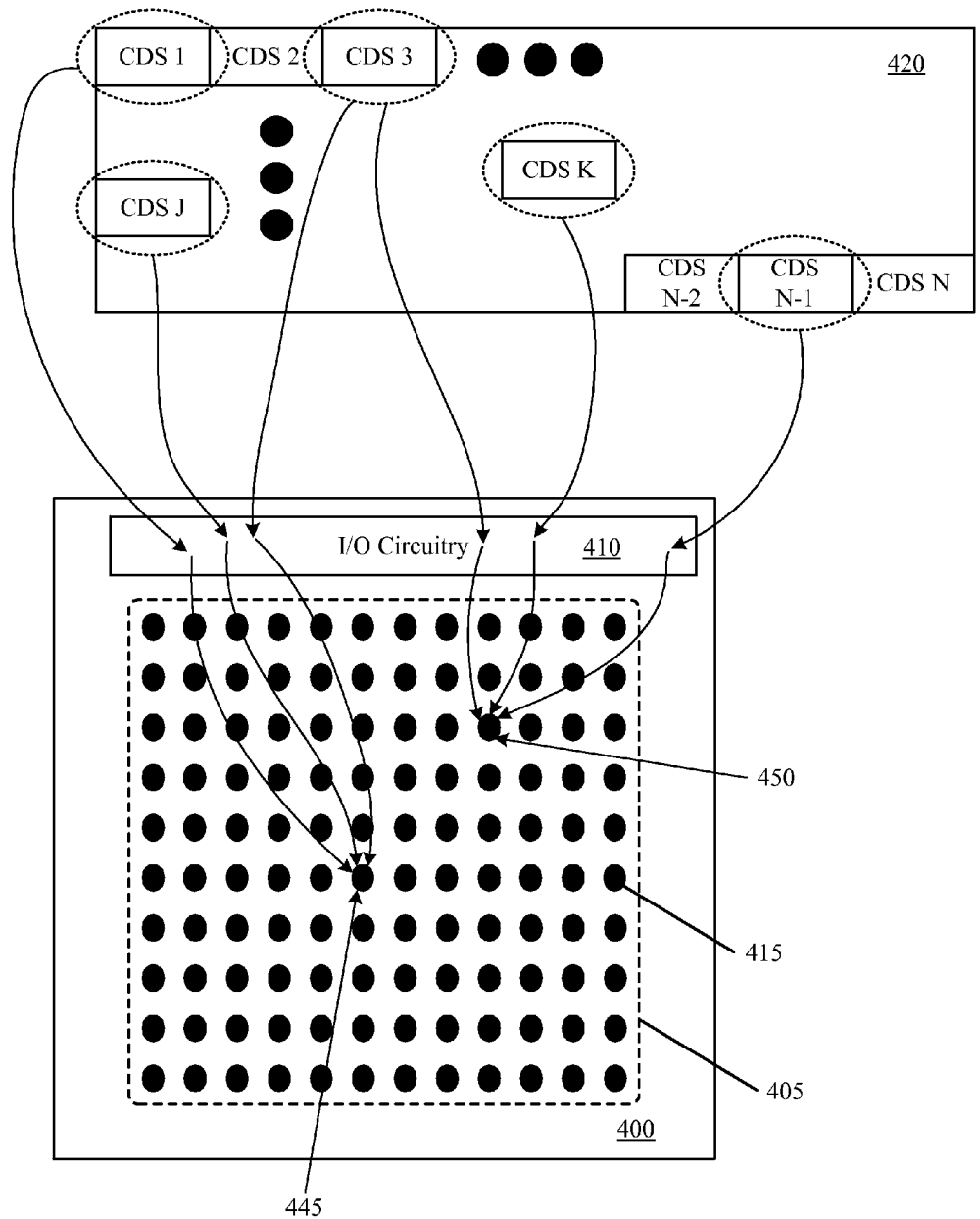
FIG. 4 illustrates the loading of configuration data onto a configurable IC of some embodiments.

In order to control the operation of the IC during each operation cycle (or "sub-cycle"), sets of configuration data are loaded onto the IC. FIG. 4 illustrates the loading of configuration data onto a configurable IC 400 of some embodiments. As shown in this figure, the IC has a configurable circuit arrangement 405 and I/O circuitry 410. The configurable circuit arrangement 405 can include any of the above described circuits (e.g., logic circuits, routing circuits, storage elements, etc.). The I/O circuitry 410 is responsible for routing data between the configurable elements 415 of the configurable circuit arrangement 405 and circuits outside of this arrangement (i.e., circuits outside of the IC, or within the IC but outside of the configurable circuit arrangement 405). Such I/O circuitry 410 could include components of the primary and/or secondary circuit structures described above (e.g., the I/O circuitry 410 may be used to access the configuration/debug network).

The data includes in some embodiments sets of configuration data that configure the configurable elements to perform particular operations. A configuration data pool 420 includes N configuration data sets ("CDS"). As shown, the input/output circuitry 410 of the configurable IC 400 routes different configuration data sets to different configurable elements 415 of the IC 400. For instance, FIG. 4 illustrates configurable element 445 receiving configuration data sets 1, 3, and J through the I/O circuitry, while configurable element 450 receives configuration data sets 3, K, and N−1 through the I/O circuitry. In some embodiments, the configuration data sets are stored within each configurable element. Also, in some embodiments, a configurable element can store multiple configuration data sets for a configurable circuit within it so that this circuit can reconfigure quickly by changing to another configuration data set for a configurable circuit. In some embodiments, some configurable elements store only one configuration data set, while other configurable elements store multiple such data sets for a configurable circuit.

Some embodiments are implemented in a configurable IC that has reconfigurable circuits that reconfigure (i.e., base their operation on different sets of configuration data) one or more times during the operation of the IC. Specifically, these ICs are configurable ICs that can reconfigure during runtime (or user mode). These ICs typically include reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it bases its operation on a different set of configuration data.

A reconfigurable circuit of some embodiments that operates on four sets of configuration data receives its four configuration data sets sequentially in an order that repeatedly loops from the first configuration data set to the last configuration data set. Such a sequential reconfiguration scheme is referred to as a 4 "loopered" scheme. Other embodiments, however, might be implemented as six or eight loopered sub-cycle reconfigurable circuits. In a six or eight loopered reconfigurable circuit, a reconfigurable circuit receives six or eight configuration data sets in an order that repeatedly loops from the last configuration data set to the first configuration data set.

Figure 5:
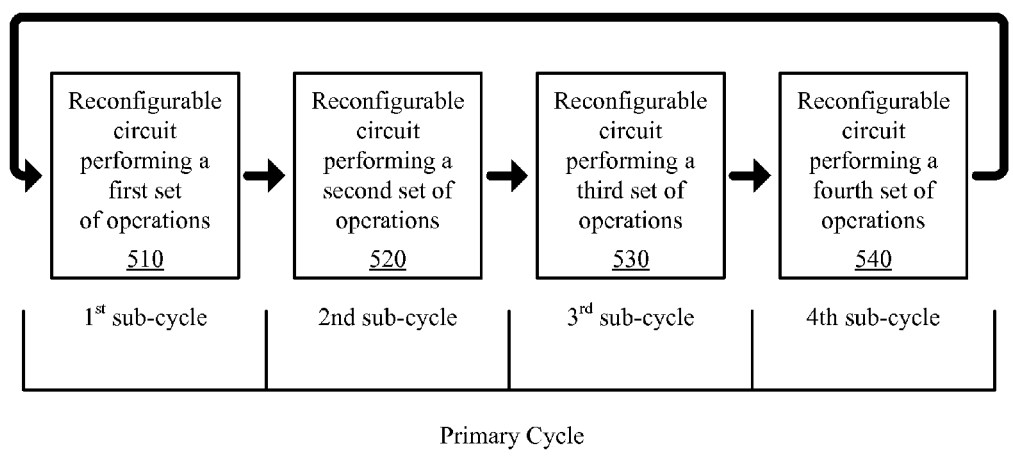
FIG. 5 conceptually illustrates an example set of operations of an IC that includes reconfigurable circuits that are sub-cycle reconfigurable (i.e., an IC that includes circuits that are reconfigurable on a sub-cycle basis).

FIG. 5 conceptually illustrates an example set of operations of an IC that includes circuits that are sub-cycle reconfigurable (i.e., an IC that includes circuits that are reconfigurable on a sub-cycle basis). Specifically, FIG. 5 shows one of the sub-cycle reconfigurable circuits of the IC that iteratively performs four sets of operations 510-540. This figure illustrates the reconfigurable circuit reconfiguring four times during four operation sub-cycles. During each of these reconfigurations (i.e., during each sub-cycle), the reconfigurable circuit performs one of the identified four sets of operations. Different embodiments may utilize more or fewer sub-cycles (e.g., 2, 6, or 8 sub-cycles). Each sub-cycle of such an IC with reconfigurable circuits may be used to initiate a particular test action, such as causing a transition in the output of a launch element and/or reading the state of a capture element.

A more detailed explanation of such sub-cycle operation and the relationship between sub-cycles and user design cycles is provided in U.S. patent application Ser. No. 11/081,823, entitled "Concurrent Optimization of Physical Design and Operational Cycle Assignment," filed on Mar. 15, 2005, issued as U.S. Pat. No. 7,496,879.

C. Test System

Figure 6:
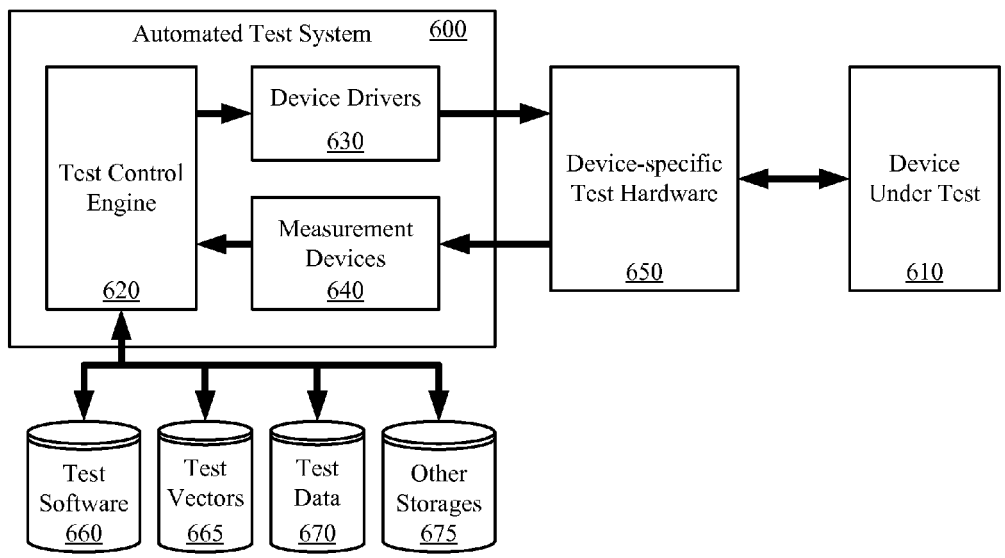
FIG. 6 illustrates an automated test system that is used to implement launch-capture testing in some embodiments.

FIG. 6 illustrates an automated test system 600 that is used to implement launch-capture testing in some embodiments. Specifically, this figure shows the use of the test system to retrieve test instructions and vectors, provide stimulus to a specific device under test 610 based on the retrieved instructions and vectors, and store the results of the testing. As shown, the test system includes a test control engine 620 for directing the operations of the test system 600, a set of device drivers 630 for providing stimulus to the device under test, and a set of measurement devices 640 for retrieving data from the device under test. In addition, the test system 600 may interface to the device under test through device-specific test hardware 650. The device-specific test hardware may include various device drivers, measurement devices, and/or controllable connection paths that route signals to the I/O pins of the device under test and/or receive signals from the I/O pins of the device under test.

The test system 600 may also have access to a set of storages. These storages may include storage for test software 660, test vectors 665, test data 670, and/or other data 675. In some embodiments these storages 660-675 (and/or other storages) may be included locally in the test system 600, while in other embodiments, the test system may access the storages through a network connection (not shown).

The test system performs test operations based on a particular set of test software associated with a particular device under test (or type of device under test). The test control engine 620 loads test software from storage 660. The test software controls the sequence of operations performed by the test control engine 620 and directs the measurement and storage of the test results. Based on the test software, the test control engine 620 may load a set of test vectors specified by the test software from storage 665. These test vectors define the state(s) of control signals, stimulus data, data capture, etc. that will be applied to the device under test. The generation and use of test vectors will be described in more detail in Section IV below.

The test control engine 620 may then send a set of signals to the device drivers 630, which in turn generate electrical signals that are supplied to the device under test 610. In some embodiments, these signals are passed through device-specific hardware 650 before reaching the device under test 610. The device under test then performs operations in response to the supplied signals. The outputs of these operations are then returned to the test control engine 620 through the set of measurement devices 640. In some embodiments, these outputs are passed through device-specific hardware 650 before reaching the measurement devices 640. The measurement devices convert the received electrical signals into test data that may be processed by the test control engine 620. This test data may then be stored in storage 670.

In some cases, the test control engine 620 (based on the test software) will conditionally perform operations based on the received test data. For instance, when a test fails, the test software may direct the test control engine to end testing of the device under test. As another example, the test software may direct the test control engine to perform a different set of tests or sequence of tests based on the results of previous test data.

Although the conceptual test system 600 has been described with reference to certain specific details, one of ordinary skill in the art will recognize that different embodiments may use different specific implementations of such a test system. For instance, some or all of the test operations may be controlled by a user (e.g., a test engineer, test operation, technician, etc.) instead of, or in conjunction with, the test software. As another example, the physical device(s) under test may be automatically connected to the test system 600 by an automated device such as a package handler or wafer prober. Such an automated device may also at least partially direct the operation of the automated test system (e.g., by directing the test system to start test operations after a device is loaded). In addition, different embodiments of the test system 600 may include various other modules and/or connections, multiple modules may be combined to form a single module, and/or a single module may be broken up into several sub-modules. Furthermore, as the test system 600 is a conceptual representation, one of ordinary skill will understand than actual implementation may include different signals, interfaces, storages, resources, etc. that are used to implement the functionality described above.

II. Launch-Capture Test Methodology

The following section describes the test methodology used by some embodiments to perform launch-capture testing. Sub-section II.A gives an overview of the launch-capture test methodology. Sub-section II.B then describes several clocking schemes used by some embodiments to achieve improved accuracy. Sub-section II.C follows that discussion with a detailed description of launch-capture testing implementation including the launch-capture test process and example launch-capture test circuit.

A. Overview

Figure 7:
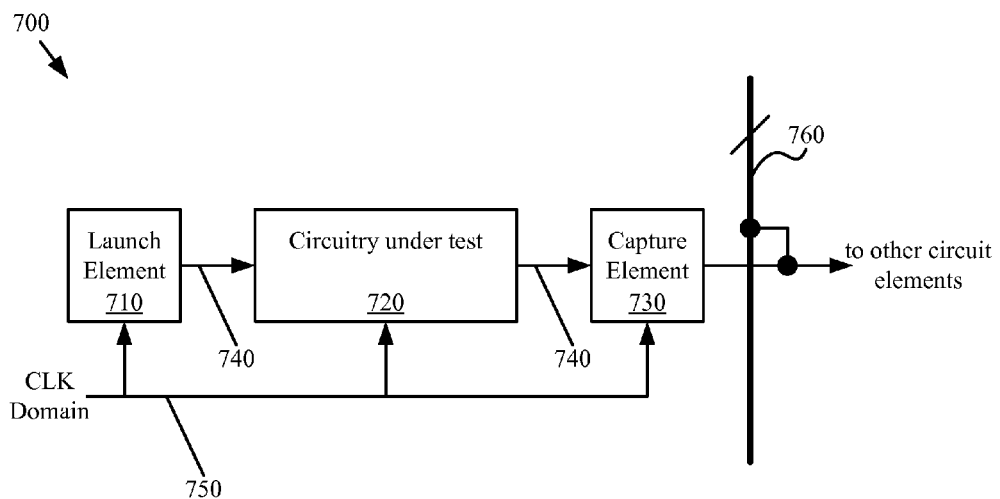
FIG. 7 conceptually illustrates a launch-capture circuit as used to evaluate a section of IC circuitry in some embodiments.

FIG. 7 conceptually illustrates a launch-capture circuit 700 as used to evaluate a section of IC circuitry in some embodiments. Specifically, this figure shows a single test route and the elements along its path. In this conceptual example, the path defining the launch-capture circuit 700 has been previously designed and the IC configured as described above in sub-section I.B. In addition, the IC has been placed in user mode and the clock has been enabled. These actions may be performed using a test system such as that described above in sub-section I.C.

As shown, the launch-capture circuit 700 includes a launch element 710 for providing a test stimulus, circuitry under test 720 for responding to the stimulus, a capture element 730 for storing the results of the test, a set of connections 740 for routing signals among the various elements, and various signal lines 750 for passing signals (e.g., control signals, configuration signals, address signals, command signals, etc.) to the elements 710-730 of the launch-capture circuit 700. In addition, this figure shows a portion of the configuration/debug network 760 used for accessing the value stored in the capture element 730.

During operation of the launch-capture circuit, the signal lines 750 supply various clock, control, and/or other signals that allow the IC to operate in user mode. The signals passed along the signal lines may be supplied by a resource such as the automated test system 600 described above in reference to FIG. 6 and/or other resources (e.g., a logic analyzer, a computer system through an appropriate interface, custom test hardware, etc.). Alternatively or conjunctively, the signals passed along the signal lines may be generated by the IC.

The launch element 710 reacts to the supplied signals and provides a test stimulus including one or more signals to the circuitry under test 720. In some embodiments, the launch element may be one or more LUTs, storage elements, multiplexers, or some other circuitry of the IC that is capable of providing a changing output.

The circuitry under test 720 receives the stimulus from the launch circuit and performs various operations based on the received stimulus and the supplied signals 750. The circuitry under test may include various circuit elements of the IC (e.g., storage elements, routing elements, wires and other pathways, etc.). In some embodiments, the circuitry under test may include elements from a single tile of the IC, elements spread across multiple tiles, and/or elements from other regions of the IC (e.g., elements from the secondary circuit structure, the configurable I/O circuitry, etc.). After processing the received stimulus, the circuitry under test 720 passes one or more output signals to the capture element 730.

The capture element receives the output of the circuitry under test 720 and stores the received output based on one or more of the supplied signals 750. In some embodiments, the capture element may be a latch that is controlled by a configuration data set. The configuration data set causes the latch to hold data in all but one operation cycle (e.g., in all reconfiguration cycles except one) and pass data in the remaining operation cycle. The value stored in the latch thus indicates whether a particular stimulus reached the end of the test route during that operation cycle in which the latch was open (i.e., when passing data). This value may then be retrieved (e.g., by an automated test system such as test system 600) for analysis using the configuration/debug network 760.

Although the conceptual circuit above was described with reference to certain features, one of ordinary skill will recognize that different embodiments may implement the launch-capture circuitry in various other specific ways. For example, the launch-capture circuit may include several capture elements for each launch element. As another example, the configuration/debug network may include other connections to the various circuits in test circuit 700. A more detailed description of the launch-capture circuitry with several specific examples will be provided in sub-section II.C below.

B. Clock Schemes for Improved Measurement Resolution

When using a single clock domain (i.e., all signals are based on a single clock), the minimum delay resolution that may be tested is equivalent to $1/f_{CLK}$, where $f_{CLK}$ represents the frequency of the clock used to drive the IC in user mode (i.e., one sub-cycle period is the best resolution that may be achieved when using a single clock source). This is because both the launch and capture elements of a particular launch-capture circuit are driven by signals that are synchronized with the single clock. Several different approaches may be used to achieve improved test resolution. Some example ways of improving the minimum delay resolution are described below. Although the examples that follow show clock signals with a 50% duty cycle, different embodiments may use different clock signals with varying duty cycles.

Figure 8:
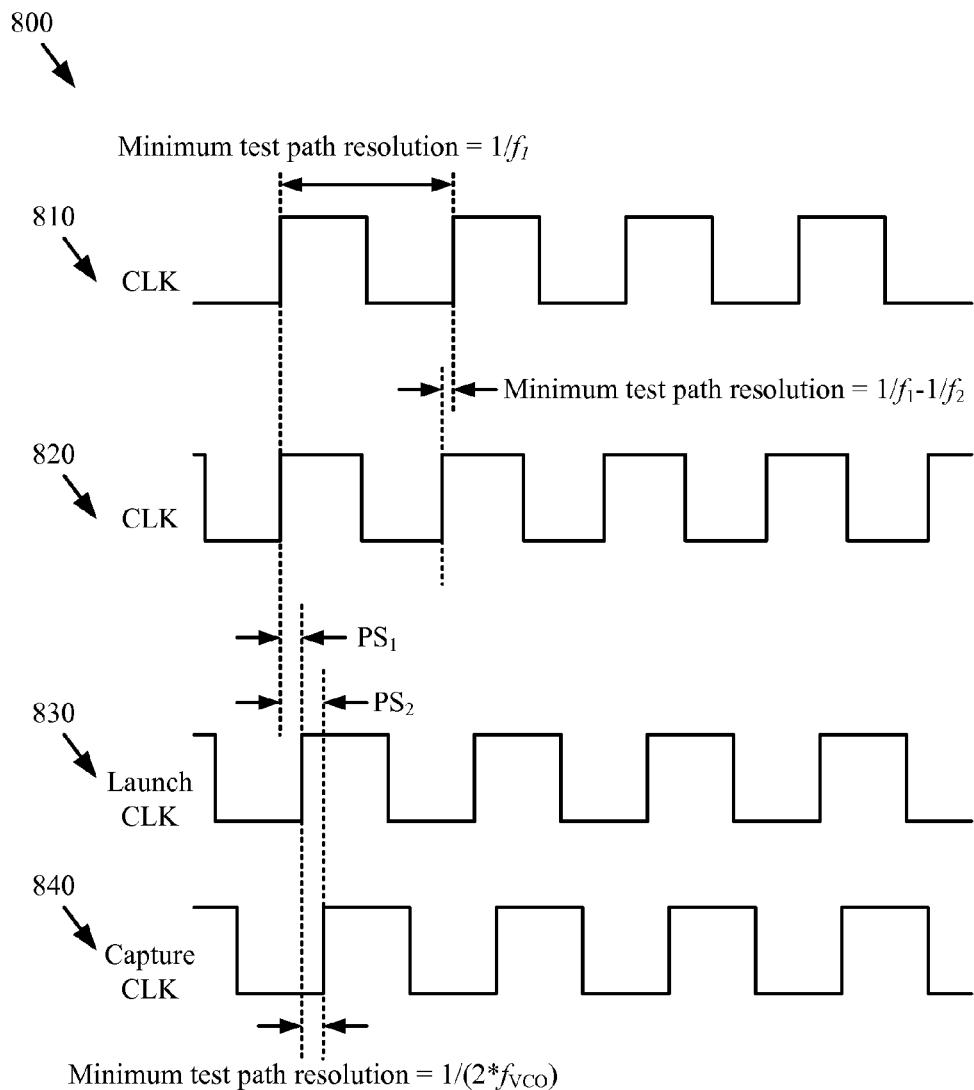
FIG. 8 illustrates several example clock signals used by some embodiments.

FIG. 8 illustrates several example clock signals 810-840 used by some embodiments. Specifically, this figure shows a timing diagram 800 that illustrates the timing relationships among various clock signals. As shown, the timing diagram includes a first clock signal 810 having a frequency $f_1$, a second clock signal 820 having a frequency $f_2$, a third clock signal 830 having a frequency $f_1$ and a phase shift $PS_1$ with respect to the first clock signal 810, and a fourth clock signal 840 having a frequency $f_1$ and a phase shift $PS_2$ with respect to the first clock signal 810. Each of the clock signals 810-840 may be used to clock some or all of the circuits of the IC. One of ordinary skill in the art will recognize that the clock signals 810-840 are conceptual representations of the actual signals. The actual signals may have varying duty cycles, slew rates, and/or other attributes. In addition, the phase relationships between the various signals are not drawn to scale and actual implementations may have various different phase relationships between signals, as needed.

When a single clock domain (e.g., the clock domain defined by clock signal 810) is used in conjunction with a test circuit such as launch-capture test circuit 700, the minimum test path delay is a single period of the clock, corresponding to one operation cycle of the IC (regardless of whether the operation cycle is a user design cycle or a sub-cycle). This minimum test path delay or resolution results because the minimum difference in time between a launch signal and a capture signal is one clock period when both signals are based in the same clock domain.

In order to improve the resolution of the delay measurement when using a single clock domain, some embodiments operate the IC using sub-cycles rather than user design cycles when testing the IC. For further improvement, some embodiments vary the operating frequency of the IC by varying the frequency of the clock signal. For instance, if a particular test fails at a clock frequency of 1.6 GHz, the test may be re-run at a clock frequency of 1.575 MHz. In this manner, the resolution may be improved to the difference between the clock period at each tested frequency. For instance, in this example, the clock period of the 1.6 GHz clock is 625 ps while the clock period of the 1.575 GHz is 635 ps. Thus, the resolution may be improved from 625 ps to 10 ps by adjusting the frequency of the clock signal. Varying the clock frequency may require re-locking a phase-locked loop (PLL) that generates the clock signals.

Figure 9:
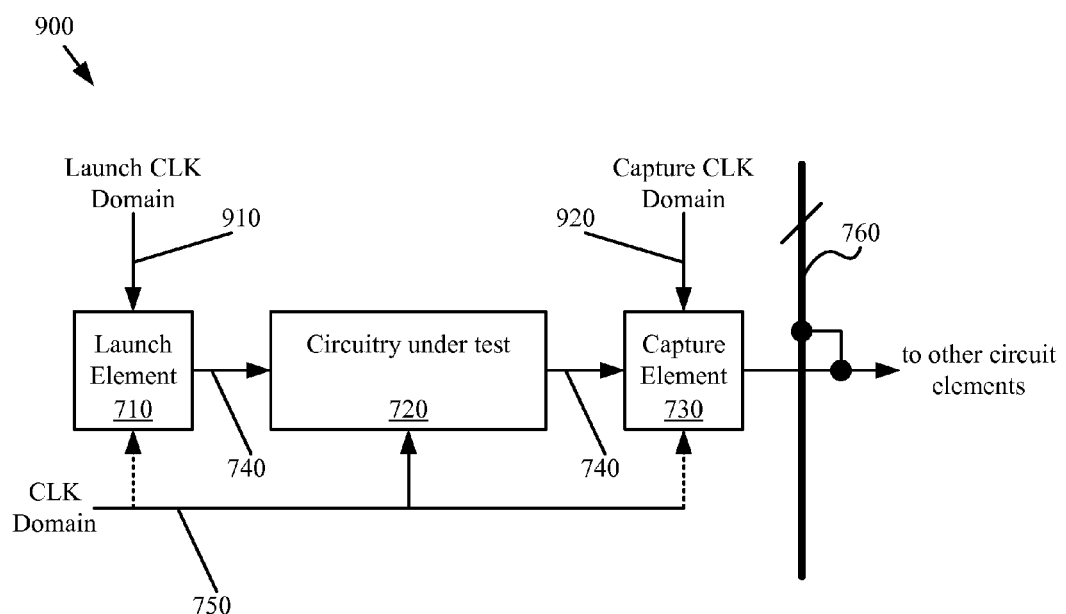
FIG. 9 illustrates one example of a launch-capture circuit, of some embodiments, that uses multiple clock domains.

Some embodiments, in order to avoid re-locking the PLL and re-running the same test at multiple frequencies, instead use multiple clock domains. FIG. 9 illustrates one example of a launch-capture circuit 900 of some embodiments that uses multiple clock domains. As shown, the launch-capture circuit 900 includes the same elements and signals 710-750 described above in reference to FIG. 7. In addition, the launch element 710 receives signals 910 that are based in a launch clock domain, while the capture element 730 receives signals that are based in a capture clock domain.

A launch-capture circuit that uses multiple clock domains may achieve improved resolution based on the relationship of the launch clock and the capture clock. Referring to FIG. 8, the third clock signal 830 may be used as a launch clock while the fourth clock signal 840 may be used as a capture clock. In this manner, the minimum resolution is defined by the phase shift between the third clock signal 830 and the fourth clock signal 840. The minimum phase shift in some embodiments is defined by $1/(2*f_{VCO})$, where $f_{VCO}$ is the maximum frequency of a voltage controlled oscillator (VCO) used by the PLL. Thus, for example, a resolution of 70 ps may be achieved when using a 7.2 GHz VCO without having to re-lock the PLL or re-run the test. Some embodiments may combine the techniques, and use phase-shifted clocks in conjunction with testing using multiple frequencies (i.e., re-locking the PLL), thus achieving better resolution than either technique used individually.

The use of multiple clock domains provides many potential advantages in addition to improved resolution. For instance, the ability to measure shorter delays allows for shorter test paths which are then easier to step and repeat. In addition, shorter paths reduce the effects of averaging among elements under test. Furthermore, the shorter paths simplify the isolation of failing elements. In addition, multiple clock domains allow the use of launch elements other than LUTs. Because of the increased availability of launch elements, more resources may be tested in parallel. Because of the increased resolution, clock speed becomes less important to the definition of the test path, thus allowing the test to be performed at various clock frequencies in order to vary power consumption (and any associated heat dissipation of the IC).

Figure 10:
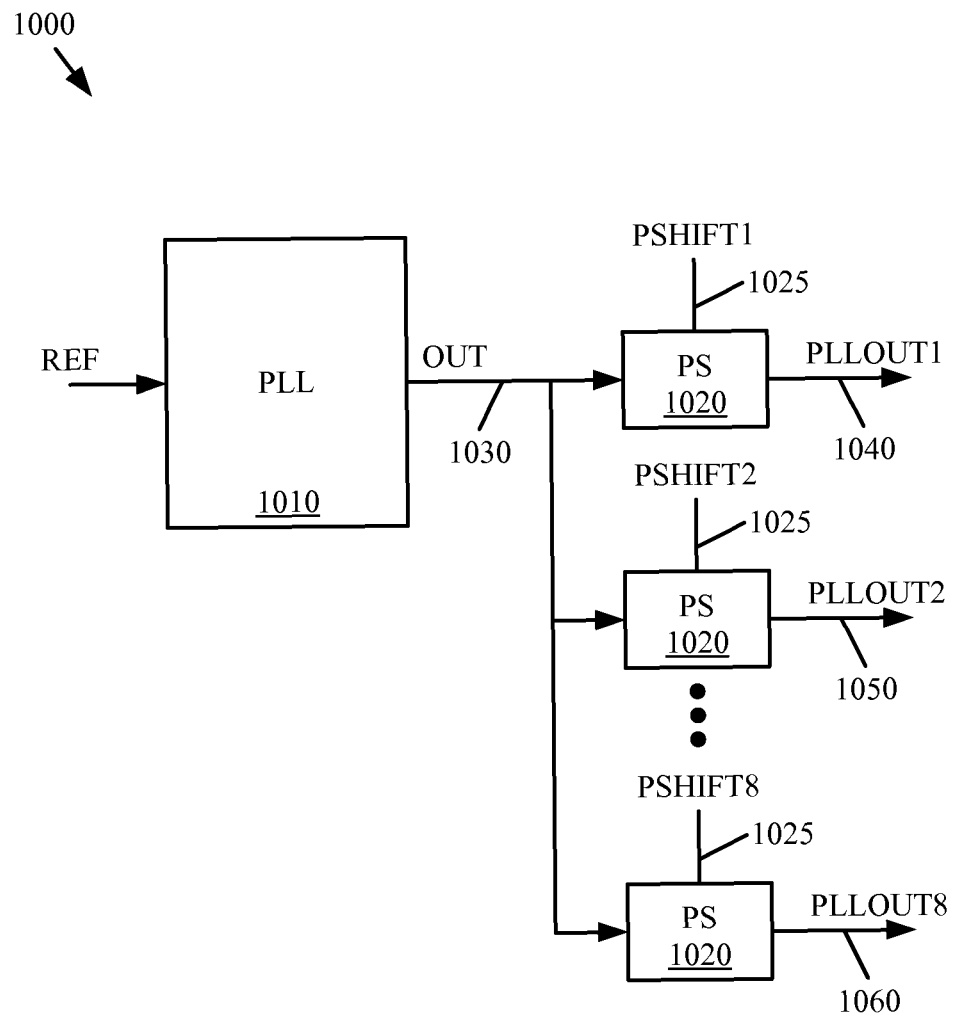
FIG. 10 illustrates one example circuit that may be used to generate phase-shifted clock signals in some embodiments.

FIG. 10 illustrates one example circuit 1000 that may be used to generate phase-shifted clock signals in some embodiments. Specifically, this figure shows a PLL generating a particular output that is phase-shifted by different amounts to generate multiple output signals that are equal in frequency, but offset in phase. In this example, the clock generation circuit includes a PLL 1010 for generating a signal that has the same phase and frequency (or multiple of the frequency) as an input reference signal, and multiple phase shift elements 1020 for, based on various phase shift control signals 1025, generating signals that are phase-shifted with respect to the PLL output 1030.

Referring again to FIG. 8, the clock generation circuit 1000 may be used to generate clock signals such as signals 810, 830, and 840. For instance, clock signal 810 may be provided by the output 1030 of the PLL 1010. Similarly, clock signal 830 may be provided by the output 1040 of a particular phase shift element 1020 that generates a relatively small amount of phase shift. Likewise, clock signal 840 may be provided by the output 1050 of a particular phase shift element 1020, which, in this example, has a greater amount of phase shift than output 1040. By using different sets of outputs 1040-1060 of phase shift elements 1020, a launch-capture test circuit that operates across multiple clock domains (e.g., launch-capture test circuit 900) different resolutions may be achieved.

In addition, the clock generation circuit 1000 may be used to iteratively adjust the phase shift of any individual output 1040-1060 in order to achieve improved measurement resolution without having to re-lock the PLL 1010 and without having to select among different outputs 1040-1060. For instance, continuing the example above, in some embodiments, the phase shift of clock signal 830 and/or clock signal 840 (as provided by outputs 1040-1050) may be adjusted by changing the phase shift control signal 1025 of either or both phase shift elements 1020 that produce the clock signals 830-840. In this manner, the phase relationship between the clock signals 830-840 may be varied without re-locking the PLL 1010 and without altering the connection scheme used to supply the clock signals.

One of ordinary skill in the art will recognize that the clock generation circuit 1000 is a conceptual example, and actual implementations may include various other elements, signals, and/or connections than those shown. For instance, the PLL may receive various control signals (e.g., range, reset, enable, etc.). As another example, different embodiments may provide different numbers of phase-shifted outputs than those shown (e.g., 4, 16, or 32 outputs).

C. Testing Implementation

1. Test Flow

Figure 11:
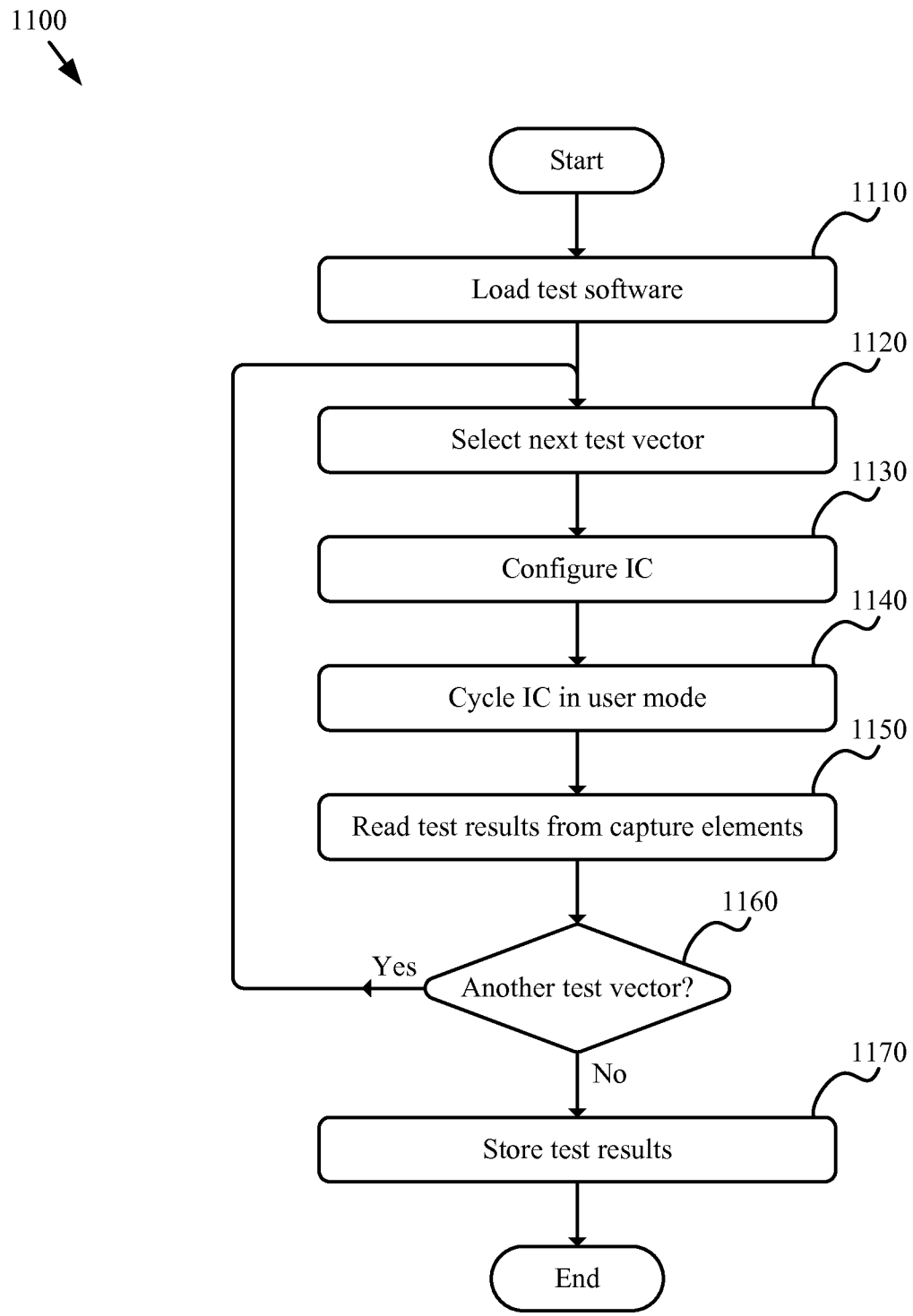
FIG. 11 illustrates a conceptual process used by some embodiments to perform launch-capture testing of an IC.

FIG. 11 illustrates a conceptual process 1100 used by some embodiments to perform launch-capture testing of an IC. Such a process may be at least partially implemented using a test system such as the automated test system 600 described above in reference to FIG. 6. In addition, the process may be used to test a configurable IC such as the IC 300 described above in reference to FIGS. 3A-3B. Process 1100 will be described with reference to FIGS. 3 and 6.

The process begins when an IC is ready to be tested. In some embodiments, a signal from a handler, prober, or other such equipment may indicate that a device is ready to be tested. In other embodiments, a signal may be generated manually (e.g., when a user of a test system presses a "start test" button).

After receiving a command to test a particular IC, the process loads (at 1110) test software onto a test system, such as automated test system 600. In some cases (e.g., when another IC has been previously tested using the same test software), operation 1110 is skipped to achieve greater efficiency. The test software may be loaded from a storage such as test software storage 660.

After loading (at 1110) the software, the process selects (at 1120) the next test vector (or set of vectors) to execute. The selection of test vectors may be controlled by the test software loaded at 1110. Alternatively, in some embodiments, the choice of test vector may be made manually (e.g., when an engineer or technician is debugging a particular test setup or particular IC).

Next, the process configures (at 1130) the IC being tested, using the test vector selected at 1120. The configuration may be performed by loading configuration data to the IC using the alternative communication pathway 310. The configuration data may be loaded in a similar manner to that described above in reference to FIG. 4. In addition to providing configuration data to the IC, the test vector may specify various signals that direct the operation of the IC during configuration (e.g., clock signal(s), control signal(s), enable signal(s), etc.). Furthermore, in addition to logical signals, the test system 600 may provide other types of signals (e.g., reference voltages, supply voltages, etc.).

After configuring (at 1130) the IC under test, the process cycles (at 1140) the IC in user mode. Cycling the IC in user mode may be accomplished by using the test vector loaded at 1120 to supply the necessary clock and/or control signals such that the IC is able to operate in user mode. While operating in user mode, various launch elements provide various test stimulus signals and various capture elements store the results of the stimulus signal(s) traversing the path(s) under test. The amount of time operating in user mode (and, consequently, the number of operation cycles that are executed) is determined by the signals provided by the test vector and/or the number of cycles through the test vector.

After cycling (at 1140) the IC in user mode, the process reads (at 1150) test results from the capture elements. Again, the signals defined by the test vector may be used to access the results stored by the capture elements. In some embodiments, the capture elements are read using the alternative communication pathway 310. Alternatively, and/or conjunctively, the test results may be read using the primary circuit structure of some embodiments.

Next, the process determines (at 1160) whether there is another test vector to execute. When the process determines that there is another test vector to execute, the process returns to operation 1120. When the process determines that there is not another test vector to execute, the process stores (at 1170) the test results and ends. In some cases, the determination of whether to execute another test vector may be based on the results of a previously-executed test vector. For instance, when an IC fails a particular test, the test software may determine that the part has failed testing, and end the testing of that IC. As another example, when an IC fails a particular test, the test software may direct the test system to execute a set of test vectors to characterize the failure, where the set of test vectors is not normally executed unless an IC fails the particular test. In other cases, the process executes all test vectors as directed by the test software, without regard to the results of testing with any previously-applied test vectors.

One of ordinary skill in the art will recognize that process 1100 is a conceptual representation of the operations used to perform launch-capture testing. The specific operations of the process may not be performed in the exact order described or different specific operations may be performed in different embodiments. Also, the process may not be performed as one continuous series of operations. Furthermore, the process could be implemented using several sub-processes, or as part of a larger macro-process. For instance, some embodiments may implement process 1100 as a sub-set of a complete test sequence. In other words, the test sequence may include testing other than that achieved using test vectors. For example, the complete test sequence may include various analog measurements, such as supply current measurements, leakage current measurements, etc.

2. Exemplary Launch-Capture Test Circuits

Figure 12:
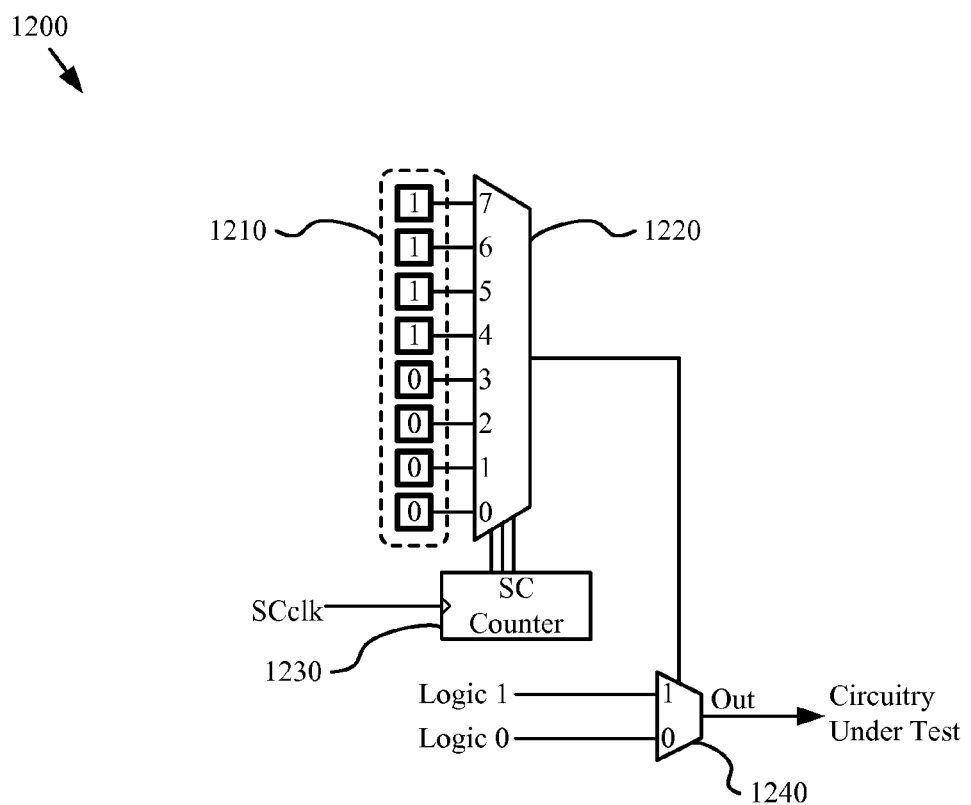
FIG. 12 illustrates one example of a launch element of some embodiments.

FIG. 12 illustrates one example of a launch element 1200 of some embodiments. Specifically, this figure shows a launch element that provides a stimulus to circuitry under test. As shown, the launch element includes a set of configuration data storage elements 1210 for storing configuration data, a multiplexer 1220 for selecting among the configuration data storage elements, a sub-cycle counter 1230 for tracking the current operation cycle, and a routing multiplexer 1240 for providing a stimulus to the circuit under test.

In some embodiments, each configuration data storage element 1210 stores configuration data corresponding to a particular operation sub-cycle. In this example, there are eight bits of data, corresponding to eight repeating operation cycles (i.e., an 8-loopered design). The multiplexer 1220 selects from among the various configuration data elements based on a set of select signals received from the sub-cycle counter 1230 (in this example, the counter has three output bits because there are eight inputs to the multiplexer). The sub-cycle counter of some embodiments generates the select signals by incrementing the counter value each time a rising clock edge is received at the clock input of the sub-cycle counter. The output of the multiplexer 1220 drives the selection control of the routing multiplexer 1240. In this manner, the routing multiplexer selects among its inputs based on the output value of the multiplexer 1240. Because the inputs to the routing multiplexer are tied to logic 1 and logic 0, each time the selection signal changes logic value, the output of the routing multiplexer changes as well. The logic 0 and logic 1 inputs can come from any source that can provide a constant value (e.g., LUTs, storage elements, supplies, etc.).

In this example, the configuration data storage elements 1210 for sub-cycles zero, one, two, and three are programmed to 0 while the configuration memory data storage elements for sub-cycles four, five, six, and seven are programmed to a 1. The sub-cycle counter 1230 is initially reset to 000. In response, the multiplexer 1220 selects port 0 so the multiplexer 1220 output is driven to 0. The selection input to routing multiplexer 1240 is 0 so the output is driven by Logic 0. As SCclk pulses are applied to the sub-cycle counter the output increments from 000 to 111 before wrapping back to 000, at which point the sequence repeats.

When the output of the sub-cycle counter is 000, 001, 010, or 011, the routing multiplexer 1240 select input is 0 and the routing multiplexer output is Logic 0. When the sub-cycle counter output becomes 100 the multiplexer 1220 output becomes 1 because the multiplexer is now selecting a configuration data storage element that has been programmed to 1. The routing multiplexer output will now transition to Logic 1 because routing multiplexer selection input is now 1. Every time that the sub-cycle counter changes from 011 to 100 the routing multiplexer output changes from Logic 0 to Logic 1. Every time that the sub-cycle counter changes from 111 to 000, the routing multiplexer output changes from Logic 1 to Logic 0. Each of the transitions of the output of the routing multiplexer can be used as a stimulus launch edge.

Figure 13:
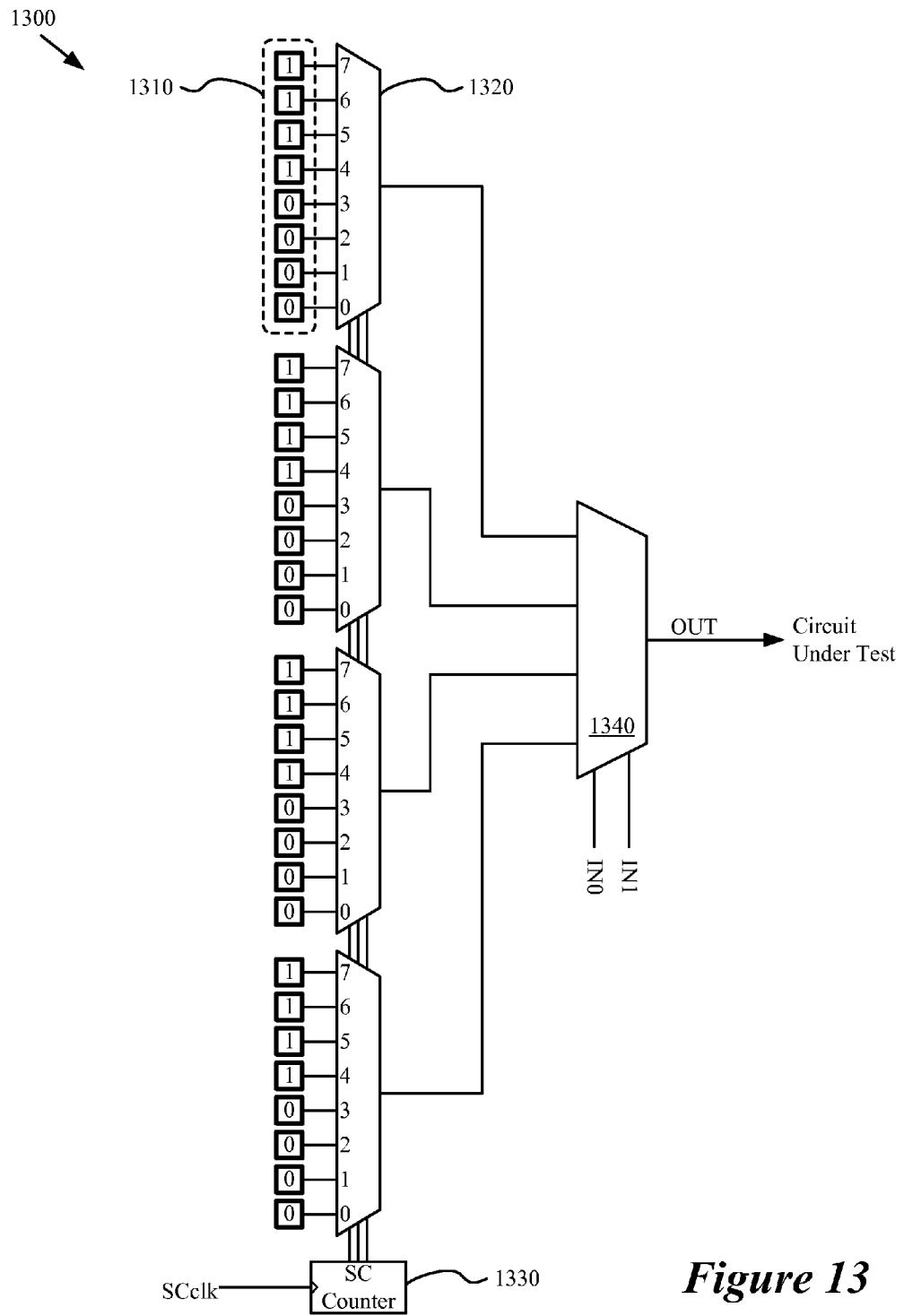
FIG. 13 illustrates another example of a launch element of some embodiments.

FIG. 13 illustrates another example of a launch element of some embodiments. Specifically, this example shows the use of a LUT 1300 as a launch element. The launch element includes multiple sets of configuration data elements 1310 for storing configuration data, several multiplexers 1320 for selecting among the configuration data storage elements, a sub-cycle counter 1330 for tracking the current operation cycle, and a routing multiplexer 1340 for providing a stimulus to the circuit under test. In this example, the configuration data storage elements have been programmed such that the output of the launch element will transition from 0 to 1 when the sub-cycle counter transitions from 011 to 100 and the output will transition from 1 to 0 when the sub-cycle counter transitions from 111 to 000. Some embodiments may supply different sets of configuration data to each of the multiplexers 1320. In this manner, the stimulus may be changed based on the select inputs to the routing multiplexer 1340, allowing for greater flexibility when designing a test solution.

Figure 14:
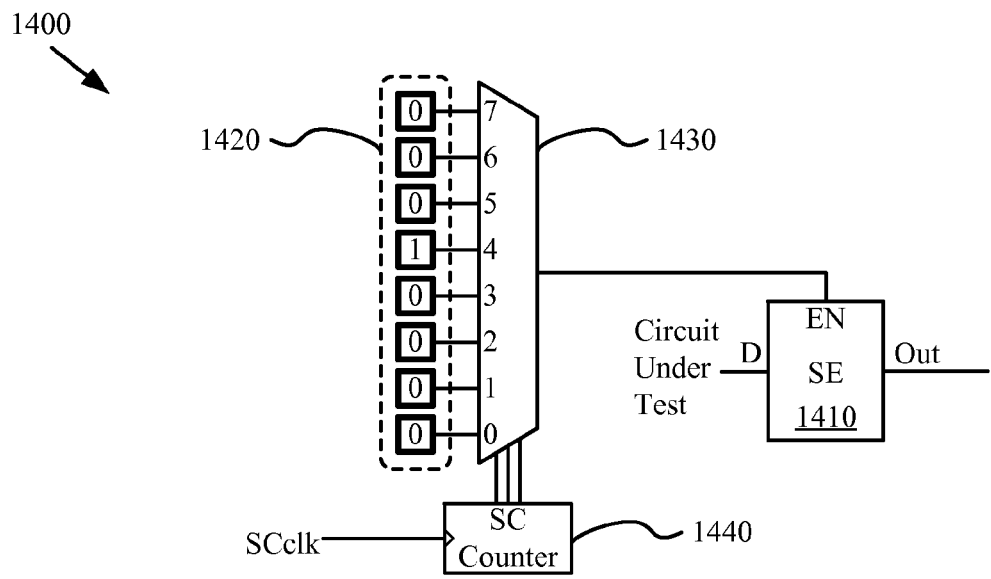
FIG. 14 illustrates an example of a capture element of some embodiments.

FIG. 14 illustrates an example of a capture element 1400 of some embodiments. Specifically, this example shows the use of a configurable storage element 1410 as a capture element. The capture element 1400 includes a set of configuration data elements 1420 for storing configuration data, a multiplexer 1430 for selecting among the configuration data storage elements, a sub-cycle counter 1440 for tracking the current operation cycle, and the configurable storage element 1410 for capturing the response of the circuitry under test. The response corresponds to a particular stimulus to the circuitry under test. In this example, when the EN pin of the storage element 1410 is 1 the storage element operates as a transparent latch, where the output of the latch is the same as the D input to the latch. When the EN pin is 0 the storage element

1410 is closed and the output of the storage element maintains its current state. The state of the EN pin is controlled by the output of the multiplexer 1430. The select inputs of the multiplexer are driven by the sub-cycle counter 1440.

In this figure, the configuration data storage elements for sub-cycles zero, one, two, three, five, six, and seven are programmed to 0. The configuration data storage element for sub-cycle four is programmed to a 1. The sub-cycle counter is initially reset to 000, causing the multiplexer 1430 to select port 0 so the output is driven to the state of configuration data element 0, which is a 0. When the output of the sub-cycle counter is 100 the EN pin of the storage element 1410 is set to 1 and the output of storage element is the state of circuit under test. When the sub-cycle counter is not 100, the EN pin of storage element is set to 0 and the storage element maintains its current state. Thus, when the output of the sub-cycle counter transitions from 100 to 101, the EN pin of the storage element transitions from 1 to 0 and the storage element will maintain the state that the circuit under test was at just before the output of the sub-cycle counter became 101. This value will be maintained until the next capture cycle (i.e., sub-cycle four in this example). Thus, if the clock is stopped when the output of the sub-cycle counter is not 100 then the state of storage element can be read and will reflect the value of the circuit under test in response to the most recent stimulus.

Figure 15:
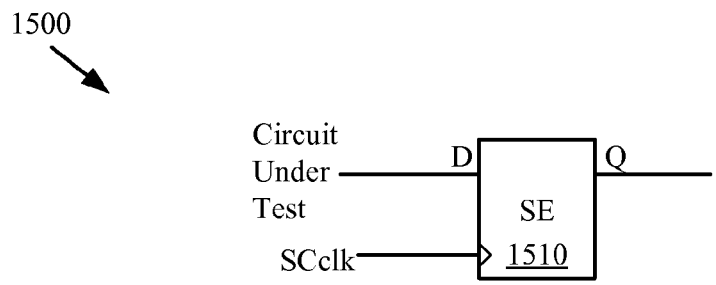
FIG. 15 illustrates another example of a capture element of some embodiments.

FIG. 15 illustrates another example of a capture element 1500 of some embodiments. Specifically, this example shows the use of a clocked storage element 1510 as a capture element. The capture element includes the clocked storage element 1510 for capturing the response of the circuitry under test, and a clock signal for clocking the clocked storage element. The response corresponds to a particular stimulus to the circuitry under test. In this example, when the SCclk signal transitions from 0 to 1, the clocked storage element captures the value supplied by the circuit under test. At all other times, the clocked storage element maintains its current state. In some cases, the clocked storage element may update its output when the SCclk signal transitions from 1 to 0. The SCclk signal is the same signal that drives various sub-cycle counters as described above in reference to FIGS. 12-14. In some embodiments, the value stored in clocked storage element 1510 is only valid for one sub-cycle (i.e., the value stored on a rising clock edge may change at the next rising clock edge) and the operation of the device must be stopped in that sub-cycle in order to read valid test data from the storage element.

Figure 16:
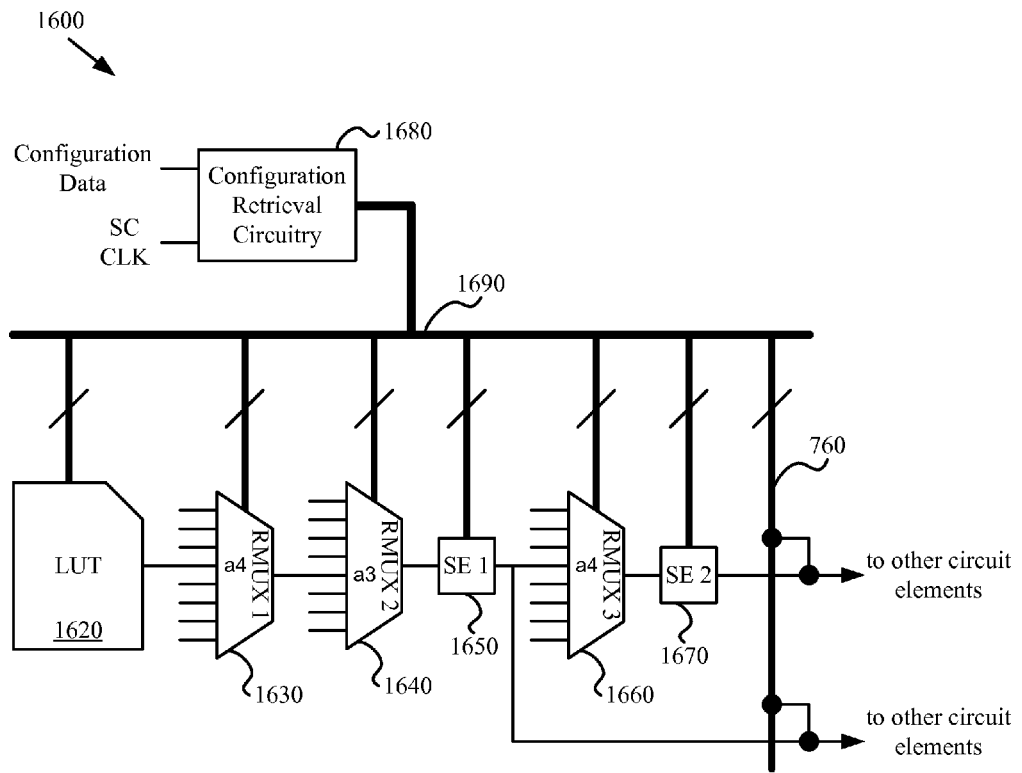
FIG. 16 illustrates an exemplary launch-capture test circuit and an associated state table of some embodiments.

FIG. 16 illustrates an exemplary launch-capture test circuit 1600 and an associated state table 1610 of some embodiments. Specifically, this figure shows the connections and states of various elements along a launch-capture test path. The launch-capture test circuit includes a LUT 1620 for providing a test stimulus, circuitry under test 1630-1660 for performing a set of operations based on the test stimulus, a storage element 1670 for capturing the response of the circuitry under test to the test stimulus, and a configuration retrieval circuitry (also referred to as space-time context switcher) 1680 for supplying configuration data to the various elements of the test circuit 1600 through a set of communication pathways 1690. In addition, this figure shows a portion of the configuration/debug network 760 used for accessing the value stored in storage element 1650 and/or storage element 1670.

The state table 1610 describes the state of each element in the launch-capture test circuit 1600 for each sub-cycle of operation (in this example, there are four sub-cycles). The operation of the circuit 1600 when in user mode (i.e., when the circuit is under test) will now be described, under the assumption that each element in the circuit functions properly. As shown, the LUT 1620 output is 0 in all sub-cycles except sub-cycle two, when the LUT output is 1. The LUT output serves as the launch stimulus for the circuit 1600. Thus, when the LUT transitions from 0 to 1 in sub-cycle two, the circuitry under test (i.e., circuit elements 1630-1660) responds to the transition.

RMUX 1 1630 has been configured to select input a4 in each sub-cycle (i.e., the input connected to the LUT 1620 output). Thus, when the output of the LUT changes, the signal on the output of RMUX 1 changes to track the change on the input of RMUX 1. Likewise, the transition is propagated through RMUX 2 1640, which is selecting the input connected to the RMUX 1 output (i.e. the "a3" input). SE 1 1650, which is "open" (i.e., transparently passing data from its input to its output) in all sub-cycles, receives the output of RMUX 2 and provides that value to the input of RMUX 3 1660. RMUX 3, which is selecting the input connected to the output of SE 1 (i.e., the "a4" input), in turn passes the value received at its input to SE 2 1670.

SE 2 functions as the capture element in this circuit 1600. Thus, SE 2 is "closed" (i.e., holding previously-stored data) for each sub-cycle except sub-cycle two. During sub-cycle two, SE 2 is open and able to respond to the stimulus provided during sub-cycle two. At the end of sub-cycle two, SE 2 is closed, thus storing the results of the launch-capture test. The data stored in SE 2 is thus valid if the test is stopped in any sub-cycle except sub-cycle two.

Figure 17:
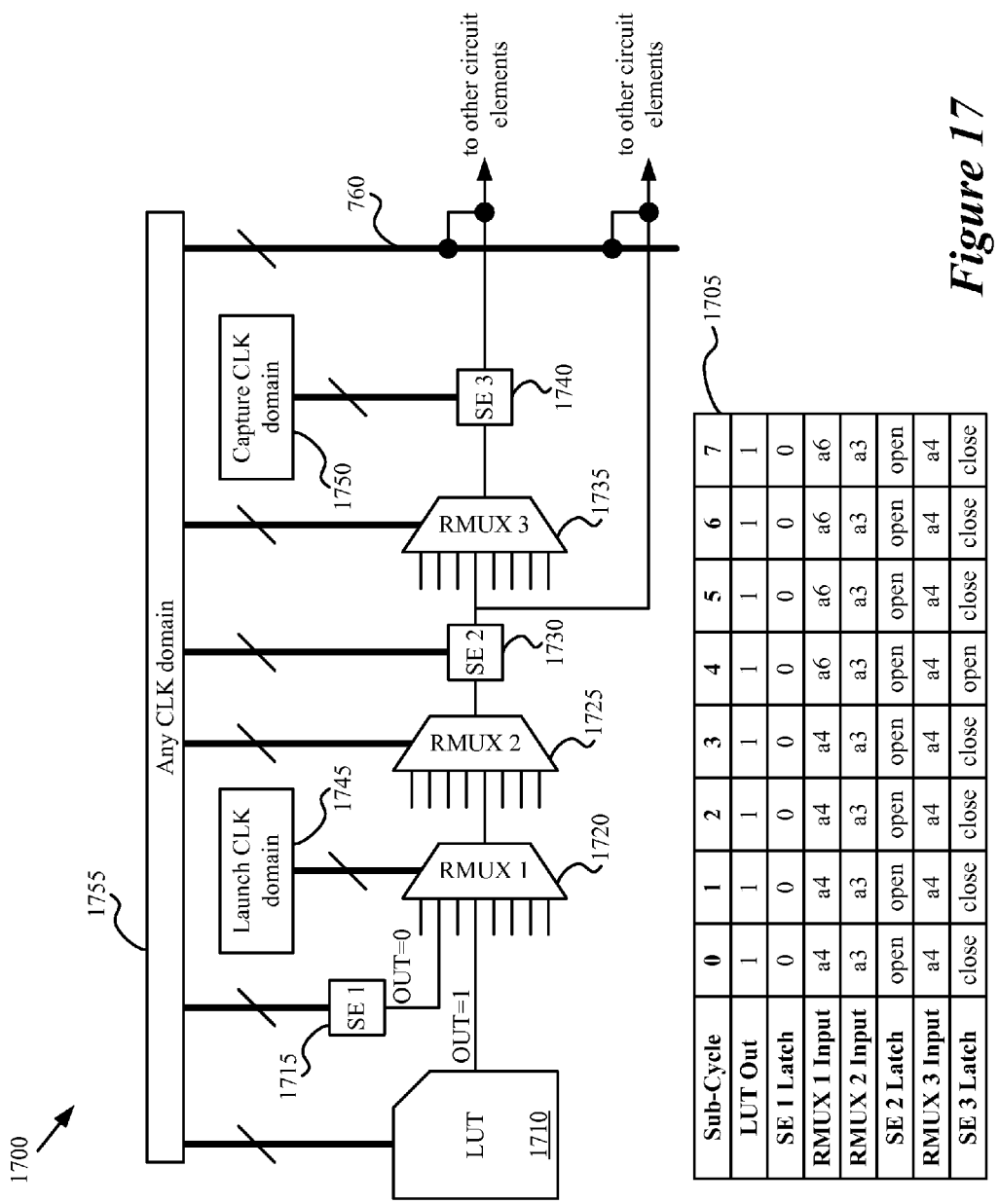
FIG. 17 illustrates another exemplary launch-capture circuit and an associated state table of some embodiments.

FIG. 17 illustrates another exemplary launch-capture circuit 1700 and an associated state table 1705 of some embodiments. Specifically, this figure shows the connections and states of various elements along a launch-capture test path that uses signals from multiple clock domains. This figure provides a more detailed example of the multiple-clock domain launch-capture circuit described above in reference to FIGS. 8 and 9.

The launch-capture test circuit includes a LUT 1710 for providing a particular output state (e.g., 1), a storage element 1715 for providing a different output state (e.g., 0), an RMUX 1720 for generating a test stimulus, other circuitry under test 1725-1735 for performing a set of operations based on the test stimulus, a storage element 1740 for capturing the response of the circuitry under test to the test stimulus, and multiple sources 1745-1755 of space-time data (each source from a different clock domain) for supplying configuration data (and/or other data) to the various elements of the test circuit 1700 through a set of communication pathways. In addition, this figure shows a portion of the configuration/debug network 760 used for accessing the value stored in storage element 1730 and/or storage element 1740.

The state table 1705 describes the state of each element in the launch-capture test circuit 1700 for each sub-cycle of operation (in this example, there are eight sub-cycles). The operation of the circuit 1700 when in user mode (i.e., when the circuit is under test) will now be described, under the assumption that each element in the circuit functions properly. As shown, the LUT 1710 output is 1 in all sub-cycles while the output of storage element SE 1 1715 is 0 in all sub-cycles. The LUT 1710 and SE 1 1715 provide their output signals to the inputs to the RMUX 1 1720 launch element.

RMUX 1 1720 is programmed to pass the value on input a4 (i.e., the output of LUT 1710) during sub-cycles zero through three, and the value on input a6 (i.e., the output of SE 1 1715) during sub-cycles four through seven. In this example, the launch element is driven by signals from the Launch CLK domain 1745. In some embodiments, the signals controlling the operation of RMUX 1 may be generated using a circuit such as sub-cycle counter 1230 described above in reference to FIG. 12. In these embodiments, the input to the sub-cycle counter may be one of the phase-shifted clock signals (e.g., Launch CLK 830 from FIG. 8) instead of the SCclk signal, while the SCclk signal (i.e., the non-phase shifted signal) may be used to generate the signals for the Any CLK domain 1755. The RMUX 1 output serves as the launch stimulus for the circuit 1700. Thus, when the output transitions from 1 to 0 in sub-cycle four, the circuitry under test (i.e., circuit elements 1725-1735) responds to the transition.

RMUX 2 1725 has been configured to select input a3 in each sub-cycle (i.e., the input connected to the RMUX 1 1720 output). Thus, when the output of RMUX 1 changes, the signal on the output of RMUX 2 changes to track the change on the input of RMUX 2. Likewise, the transition is propagated through SE 2 1730, which is "open" (i.e., transparently passing data from its input to its output) in all sub-cycles, and receives the output of RMUX 2 and provides that value to the input of RMUX 3 1735. RMUX 3, which is selecting the input connected to the output of SE 2 (i.e., the "a4" input), in turn passes the value received at its input to SE 3 1740.

SE 3 functions as the capture element in this circuit 1700. Thus, SE 3 is closed for each sub-cycle except sub-cycle four. During sub-cycle four, SE 3 is open and able to respond to the stimulus provided during sub-cycle four. At the end of sub-cycle four, SE 3 is closed, thus storing the results of the launch-capture test. The data stored in SE 3 is thus valid if the test is stopped in any sub-cycle except sub-cycle four. In this example, the capture element is driven by signals from the Capture CLK domain 1750. In some embodiments, the signals controlling the operation of SE 3 may be generated using a circuit such as sub-cycle counter 1230 described above in reference to FIG. 12. In these embodiments, the input to the sub-cycle counter may be one of the phase-shifted clock signals (e.g., Launch CLK 840 from FIG. 8) instead of the SCclk signal, while the SCclk signal (i.e., the non-phase shifted signal) may be used to generate the signals for the Any CLK domain 1755.

In some ICs, the storage element 1715 providing data to an RMUX (e.g., RMUX 1720) may be a configuration data storage element (i.e., a storage element that stores configuration data that has been previously loaded to the IC). The RMUX connected to the configuration data storage element may include many minimum width transistors, which are subject to more transistor-to-transistor variation than transistors that are wider than the minimum width. For this reason, when testing such ICs, some embodiments test the delay of each RMUX included in the IC.

In addition, the configuration memory access logic of these ICs may include many minimum width transistors. Thus, when testing such ICs, some embodiments test the delay from each configuration data storage element through the access logic and RMUX connected to the output of the configuration data storage element. The use of separate clock domains as described above, allows more accurate testing of these elements (because fewer other elements are included in the same test path). By improving the timing resolution that is able to be tested, the delay through more elements is able to be tested in parallel, which greatly increases efficiency because only the first RMUX in the path may be tested for this delay, as all other RMUXs will be relative to some unknown propagation delay of the circuits that precede those RMUXs in the test path.

Figure 18:
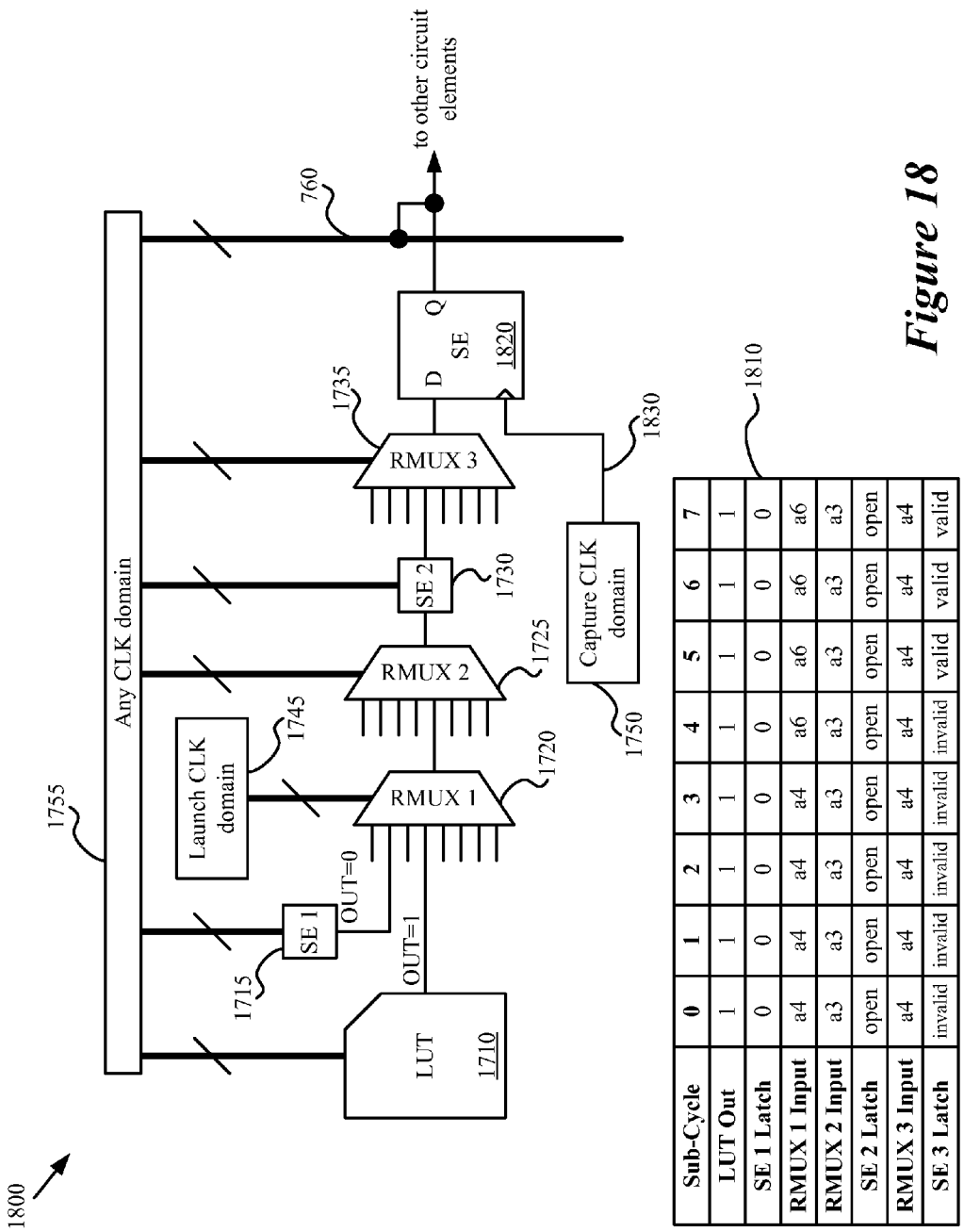
FIG. 18 illustrates another exemplary launch-capture circuit and an associated state table of some embodiments.

FIG. 18 illustrates another exemplary launch-capture circuit 1800 and an associated state table 1810 of some embodiments. Specifically, this figure shows a variation of the launch-capture circuit 1700 where the capture element is a clocked storage element. The launch-capture test circuit 1800 includes a LUT 1710 for providing a particular output state (e.g., 1), a storage element 1715 for providing a different output state (e.g., 0), an RMUX 1720 for generating a test stimulus, other circuitry under test 1725-1735 for performing a set of operations based on the test stimulus, a clocked storage element 1820 for capturing the response of the circuitry under test to the test stimulus, and multiple sources 1745-1755 of space-time data (each source from a different clock domain) for supplying configuration data (and/or other data) to the various elements of the test circuit 1800 through a set of communication pathways. In addition, this figure shows a portion of the configuration/debug network 760 used for accessing the value stored in the capture element 1820.

The launch-capture circuit 1800 functions in a similar manner to launch-capture circuit 1700 described above, except for the operation of the clocked storage element 1820. The clocked storage element is controlled by a clock signal 1830 from the Capture CLK domain 1750. In this example, the capture CLK is stopped during sub-cycle four, thus preserving the captured value in the clocked storage element until the end of sub-cycle seven. In this example, the capture CLK is re-started in sub-cycle zero (and thus the data in the clocked storage element is no longer valid for purposes of the test), however different embodiments may enable and disable the launch CLK signal during different sub-cycles.

One of ordinary skill in the art will recognize that while the various circuits described above in reference to FIGS. 12-18, different embodiments may implement such circuits in different ways without departing from the spirit of the invention. For instance, different implementations might include different individual elements in the test path, different connections between those elements (and/or other elements of the IC), different sets of signals being supplied to those elements, etc.

For example, although FIG. 16 shows configuration data being supplied to all circuit elements by a single configuration retrieval circuitry 1680, some embodiments may include such a configuration retrieval circuitry at each circuit element (or supply one configuration retrieval circuitry for a sub-set of the circuit elements). As another example, these circuits have been shown as single instances, but may be repeated across an IC to provide greater test coverage (e.g., the repeating launch-capture test circuits described above in reference to FIG. 2). As yet another example, not all circuits or pathways may be represented completely. For instance, the storage elements 1650 and 1670 may include multiple inputs and/or outputs, and/or include connections to and/or from circuitry or communication that is not shown in FIG. 16.

3. Data Validation

In some embodiments, the operation of the IC may be enabled and/or disabled asynchronously to the supplied sub-cycle clock when the IC is being tested in user mode. Such asynchronous operation may make it difficult to ascertain which sub-cycle was active when the IC is disabled. Because many launch-capture test circuits only produce valid test data in a sub-set of the operation cycles, it may be critically important to determine in which sub-cycle the IC ended operation and, thus, whether a particular capture element holds valid data.

Figure 19:
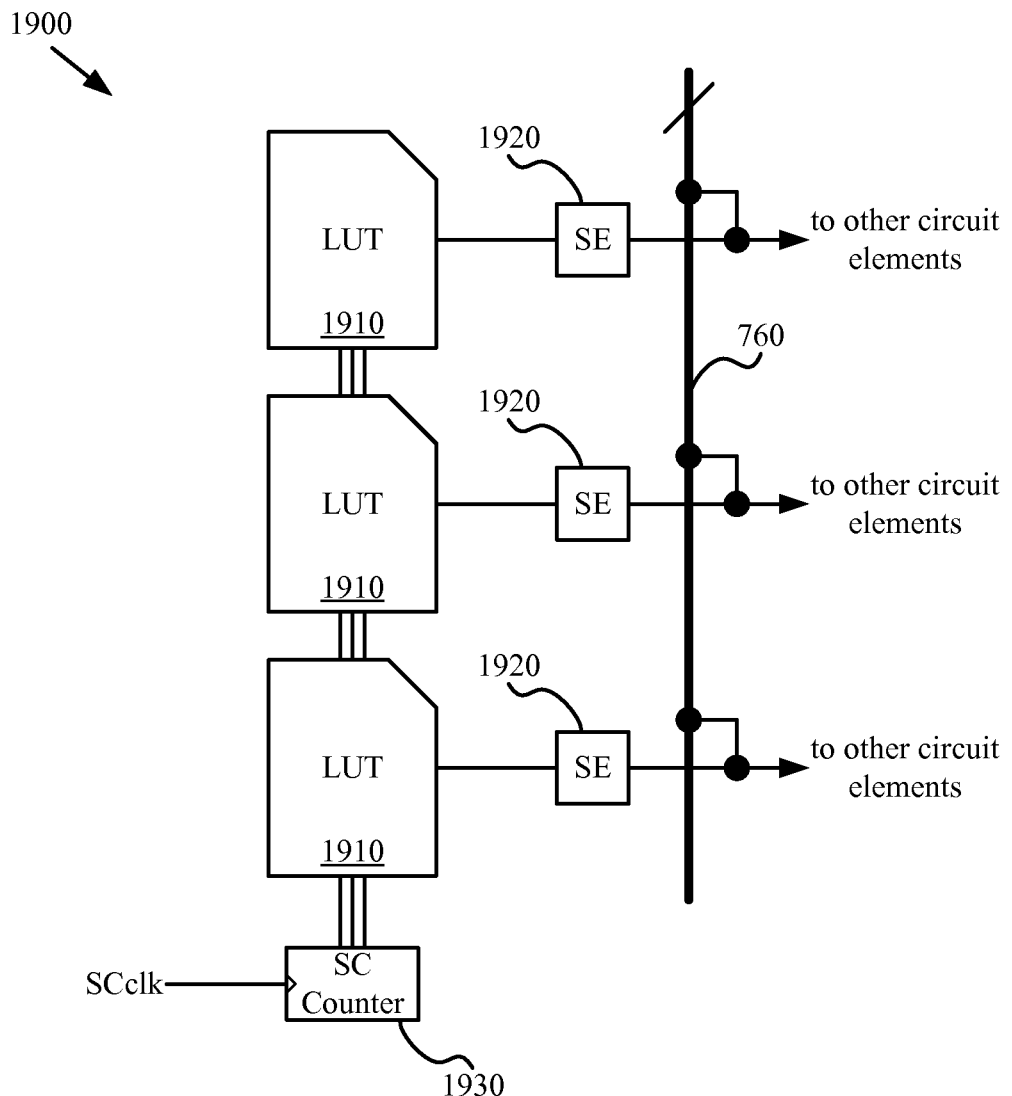
FIG. 19 illustrates one example monitor circuit that may be used in some embodiments to determine in which sub-cycle the IC under test ended operation.

FIG. 19 illustrates one example monitor circuit 1900 that may be used in some embodiments to determine in which sub-cycle the IC under test ended operation. Specifically, this figure shows the use of existing configurable circuitry of the IC to monitor and store the current operating sub-cycle of the IC. As shown, the monitor circuit includes a set of three LUTs 1910 that together are for determining the current operating cycle of the IC, three storage elements 1920 for controllably storing data, each storage element associated with a particular LUT, and a sub-cycle counter 1930 for tracking the current operation cycle. Such a monitor circuit may be implemented using available configurable circuitry of the IC (e.g., using the set of circuits 260 as described above in reference to FIG. 2).

The sub-cycle counter 1930 receives a sub-cycle clock signal. The sub-cycle counter increments the count at every clock cycle. The three outputs of the sub-cycle counter thus indicate the current operation sub-cycle in some embodiments. These outputs are supplied to each of the LUTs 1910, directing each LUT to provide data corresponding to the current sub-cycle. Each LUT then supplies its output to a storage element 1920. The storage elements may be controlled in such a way as to store the values being output by the LUTs during each clock cycle. In some embodiments, the storage elements may be controlled by a signal that is asynchronous to the SCclk signal.

In this example, the monitor circuit includes three bits, corresponding to an eight sub-cycle design. For instance, a three bit value of 000 (each bit corresponding to the output of one of the LUTs 1910) may identify the sub-cycle as sub-cycle 0 while a value of 101 may identify the sub-cycle as sub-cycle 5. Different embodiments may include different numbers of bits (e.g., two bits for a four sub-cycle design, four bits for a sixteen sub-cycle design, etc.).

Figure 20:
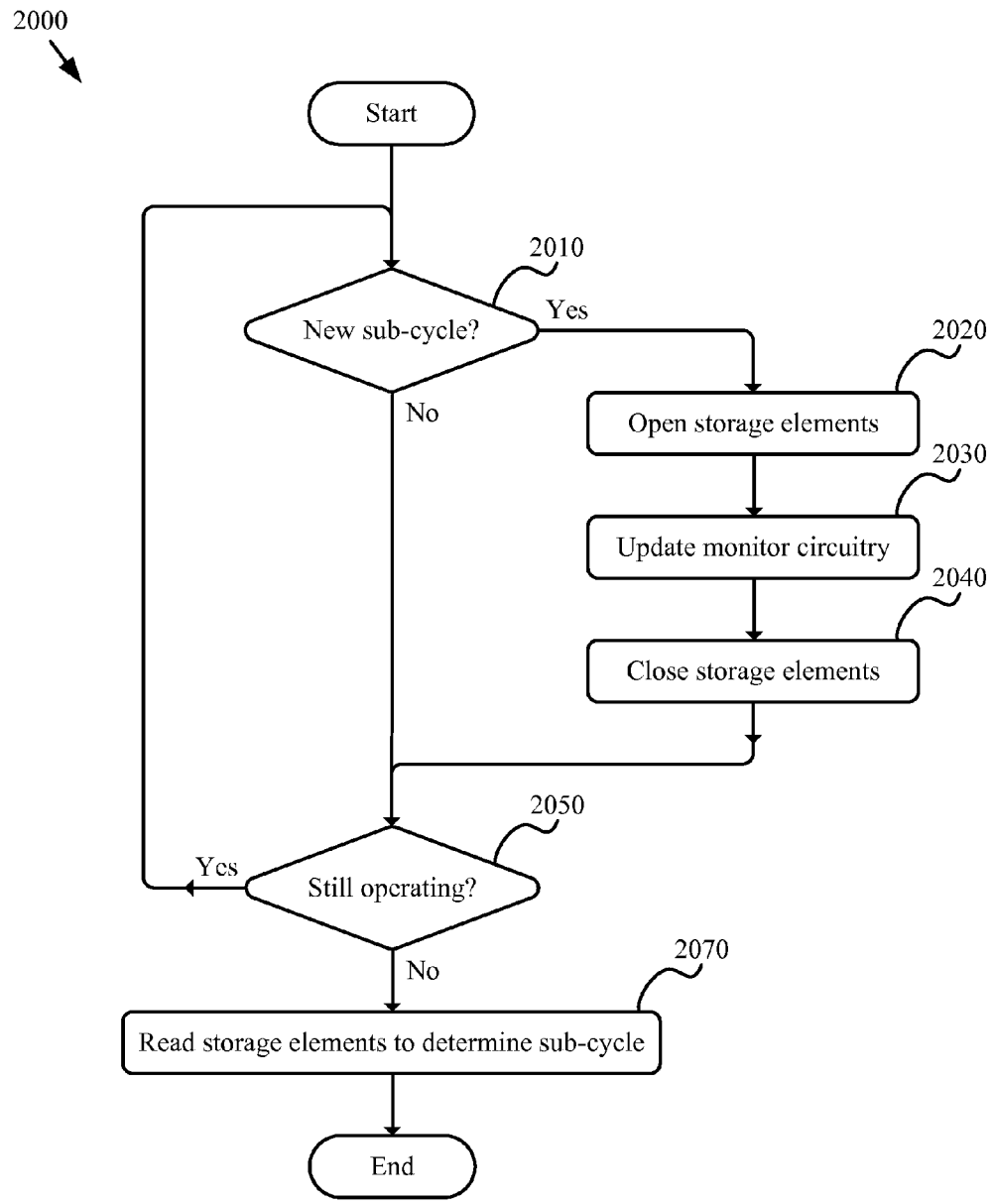
FIG. 20 illustrates a conceptual process that may be used by some embodiments to control sub-cycle monitor circuitry such as that shown in FIG. 19.

FIG. 20 illustrates a conceptual process 2000 that may be used by some embodiments to control sub-cycle monitor circuitry such as that shown in FIG. 19. Process 2000 could be performed as a sub-process of process 1100 described above in reference to FIG. 11. Process 2000 will be described with reference to FIG. 19 but one of ordinary skill will recognize that the process could be performed with (and/or by) various other circuit arrangements. The process begins, in some embodiments, when the IC begins operating in user mode. The process may determine that the IC is operating in user mode by determining whether the SCclk signal being supplied to the sub-cycle counter 1930 is changing. Different embodiments may determine that the IC is operating in user mode in different ways. For instance, some embodiments may receive a trigger signal from a test system indicating that the IC is operating in user mode. As another example, some embodiments may receive an indication from the IC (e.g., an output signal provided by the IC) that the IC is operating in user mode.

After determining that the IC is being operated in user mode, the process determines (at 2010) whether a new sub-cycle of operation has been detected. In some cases, this determination may include receiving a particular transition (e.g., from 0 to 1) on the clock signal SCclk that is being supplied to the sub-cycle counter 1930. In other cases, a trigger signal or other indication of a new sub-cycle may be provided or available.

When the process determines (at 2010) that a new sub-cycle of operation has been detected, the process opens (at 2020) storage elements indicating the current sub-cycle (e.g., storage elements 1920), updates (at 2030) the monitor circuitry (e.g., by updating the value output from the sub-cycle counter 1930, which in turn causes the values output by the LUTs 1910 to be updated), and closes (at 2040) the storage elements that hold the value of the current sub-cycle (e.g., storage elements 1920).

When the process determines (at 2010) that no new sub-cycle of operation has been detected, the process determines (at 2050) whether the IC is still operating in user mode. This determination may be made in a similar manner to that described above in reference to the start of process 2000. When the process determines (at 2050) that the IC is still operating, the process performs operation 2010 as described above. When the process determines (at 2050) that the IC is not still operating, the process reads (at 2070) the storage elements to determine the sub-cycle of operation in which the IC was disabled and then ends.

One of ordinary skill in the art will recognize that process 2000 is a conceptual representation of the operations used to determine the last operating sub-cycle of the IC under test. The specific operations of the process may not be performed in the exact order described or different specific operations may be performed in different embodiments. Also, the process may not be performed as one continuous series of operations. Furthermore, the process could be implemented using several sub-processes, or as part of a larger macro-process. For instance, some embodiments may implement process 2000 as a sub-set of operations within a test sequence.

III. Fault Isolation

Some configurable ICs include storage elements at the output of most of the LUTs, at the output of most RMUXs, and/or at other locations within the IC. These storage elements may be read in some embodiments to isolate failure locations along a path (this process is alternatively referred to as "fault isolation"). In some cases, the placement of the storage elements allows fault detection at an elemental level. In addition, some embodiments may further examine a particular failing element to determine which specific paths, transistors, and/or other sub-elements of the failing element are malfunctioning.

Figure 21:
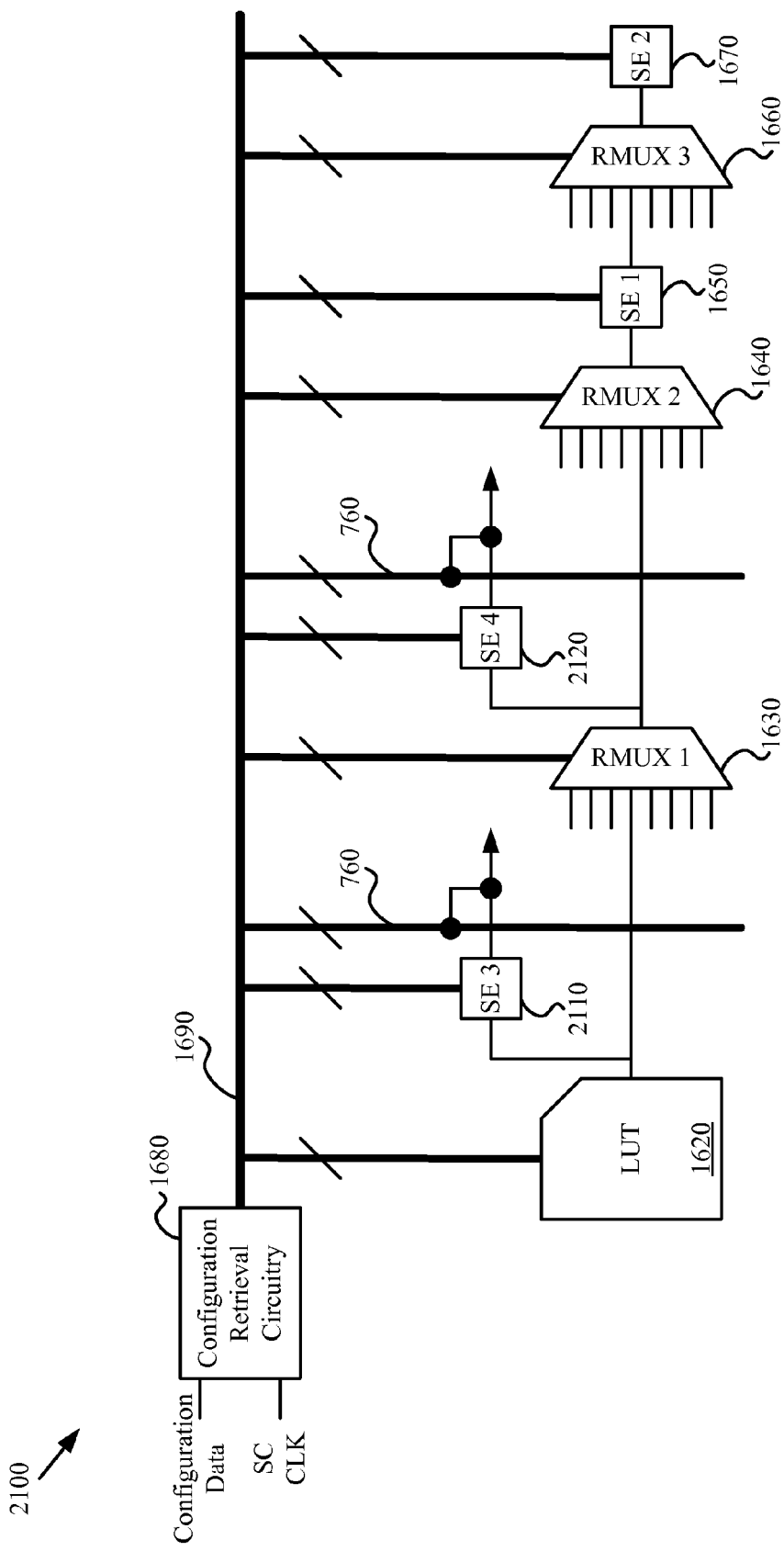
FIG. 21 illustrates an exemplary launch-capture test circuit of some embodiments that includes the elements of launch-capture circuit of FIG. 16 with additional components to enable fault isolation.

FIG. 21 illustrates an exemplary launch-capture test circuit 2100 of some embodiments that includes the elements of launch-capture circuit 1600 of FIG. 16 with additional components to enable fault isolation. In addition to the components and operations described above in reference to FIG. 16, the launch-capture test circuit 2100 includes two additional storage elements 2110 and 2120 for storing the state at certain connections of the launch-capture test circuit 2100.

As shown, the output of LUT 1620 is connected to storage element SE 3 2110, while the output of RMUX 1 1630 is connected to storage element SE 4 2120. The values in these storage elements may be used to determine whether RMUX 1 is functioning properly. When the value in SE 3 matches the value in SE 4, that indicates that RMUX 1 is functioning properly (i.e., that RMUX 1 is passing the value from the selected input to its output). When the value in SE 3 does not match the value in SE 4, that indicates that RMUX 1 is not functioning properly.

In addition to including elements SE 3 and SE 4 to determine whether RMUX 1 is functioning properly, some embodiments may include multiple other storage elements within the circuit 2100. For example, some embodiments may include a storage element at the output of each element 1620-1670 of the circuit 2100, thus allowing verification of each element along the tested path.

When determining that a particular element along a path is not functioning properly, different embodiments may perform different sets of operations. One conceptual process for responding to a determination that a particular element is not functioning properly is described below in reference to FIG. 24.

Figure 22:
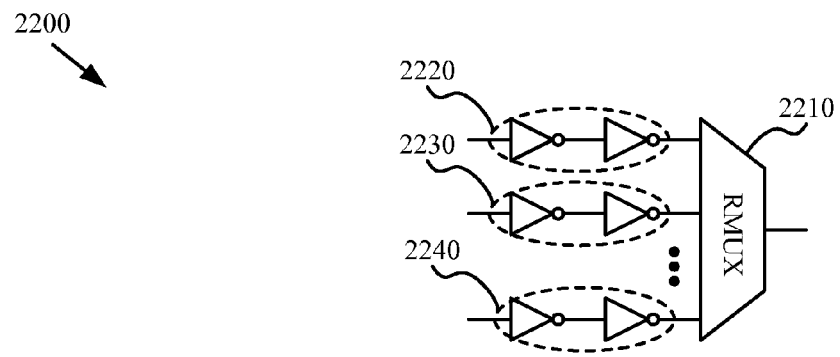
FIG. 22 illustrates a circuit that may be further in some embodiments evaluated when the circuit has been determined to be malfunctioning.

FIG. 22 illustrates an example of a circuit 2200 that may be further evaluated in some embodiments when the circuit has been determined to be malfunctioning. Specifically, this figure shows additional paths that may be tested when determining that a particular circuit element (e.g., an RMUX) is malfunctioning. In this example, the RMUX may be any RMUX along a test path, where storage elements at the input and output of the RMUX (not show) have indicated that the RMUX is non-functional.

The circuit 2200 includes an RMUX 2210 that has been determined to be malfunctioning, and several paths 2220-2240 for routing input signals to the RMUX. In this example, each path includes two buffers, however the input paths may include various different elements, such as wires, buffers, delay elements, etc.

Once the RMUX 2210 has been determined to be malfunctioning, by, for example, testing the RMUX in a launch-capture test circuit using path 2220, further testing may be performed to further isolate the malfunction. For example, by supplying test stimulus to the other input paths 2230-2240 of the RMUX, one or more individual transistors (and/or connections) that make up the multiplexer may be identified as malfunctioning. For example, if only one input to the RMUX fails, that may indicate that a transistor and/or connection unique to that input has caused the malfunction. Whereas if two or more inputs fail, that may indicate that either several transistors and/or connections (i.e., a transistor and/or connection associated with each failing input) have malfunctioned or that a single transistor and/or connection shared by all of the failing inputs has malfunctioned.

Figure 23:
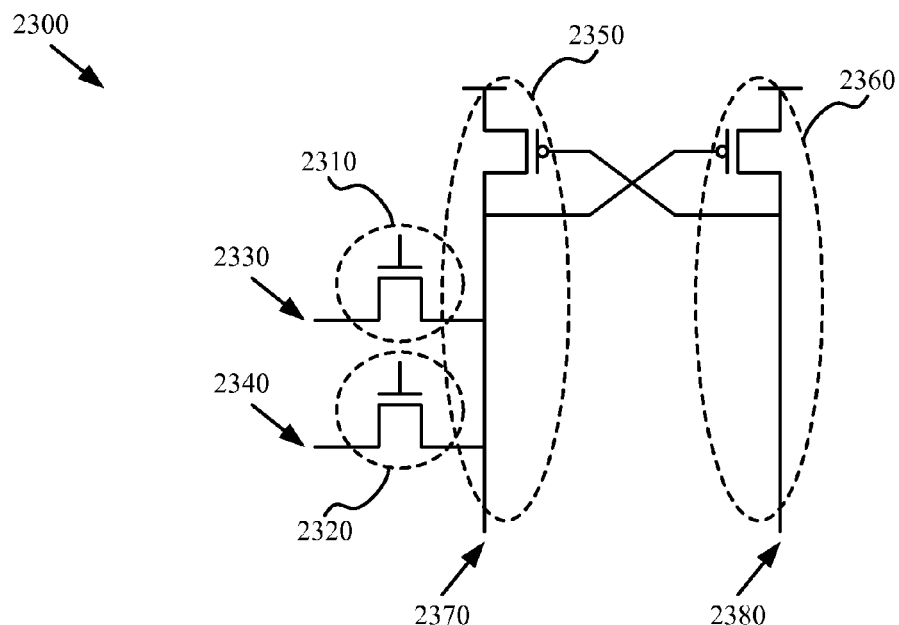
FIG. 23 illustrates a transistor-level example of using fault isolation to identify a failing path or transistor within a malfunctioning element.

FIG. 23 illustrates a transistor-level example of using fault isolation to identify a failing path or transistor within a malfunctioning element 2300. Specifically, this figure shows the use of fault isolation to identify specific failing transistors. As shown, the malfunctioning element 2300 includes two transistors 2310 and 2320 for selecting between two inputs 2330 and 2340 to the element 2300 and a cross-coupled pair of pull-up transistors 2350 and 2360 each for driving a particular output 2370 or 2380 of the element 2300.

By alternatively enabling the input transistors 2310 and 2320, each transistor may be individually verified as functional or malfunctioning. Such testing may be performed on multiple other inputs or connections of a malfunctioning element.

If a difference in timing between a 0 to 1 transition and a 1 to 0 transition is encountered, it may indicate that a particular pull-up (and/or pull-down) path is slow. In this example, by individually enabling one or more inputs connected to path 2370 and one or more inputs connected to path 2380 (not shown), each pull-up transistor 2350 or 2360 may be individually verified as functional or malfunctioning. Similar testing may be performed on other similar circuit elements.

Figure 24:
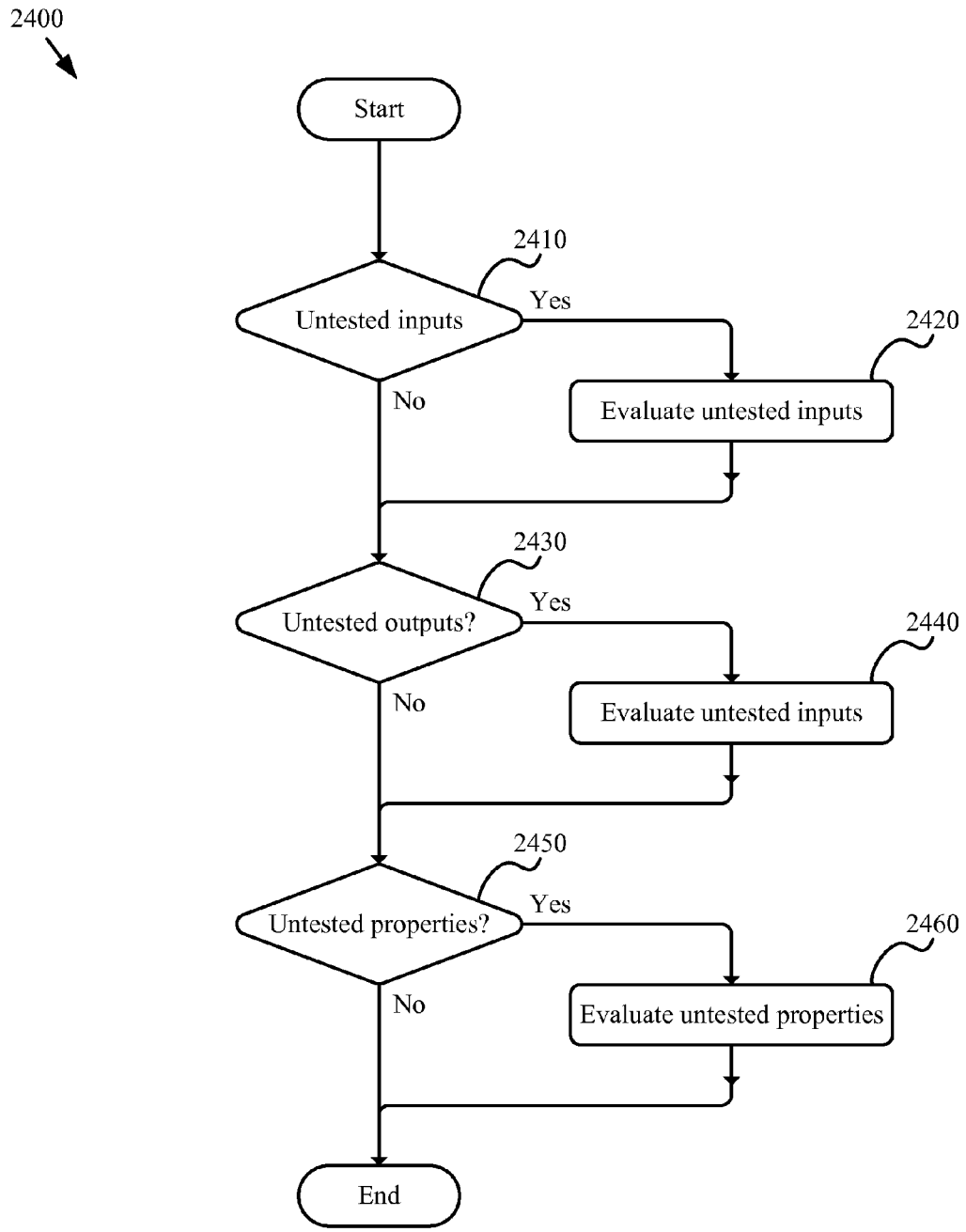
FIG. 24 illustrates a conceptual process for performing fault isolation analysis in some embodiments.

FIG. 24 illustrates a conceptual process 2400 for performing fault isolation analysis in some embodiments. Such a process may be used to examine a device during IC testing, failure analysis, device characterization, device qualification, etc. For example, process 2400 could be performed as a sub-process of process 1100 described above in reference to FIG. 11. Process 2400 will be described with reference to FIGS. 21-23. The process begins when a malfunction occurs. The malfunction may be identified when performing test of an IC, during end-use of the IC, or some other way. In particular, the malfunction may identify a failing circuit element, such as the RUMX 1630 identified as malfunctioning when the values in the storage elements 2110 and 2120 do not match.

Once a particular malfunctioning element is identified, the process determines (at 2410) whether there are other, untested inputs to the malfunctioning element. When there are, the process evaluates (at 2420) each of the previously untested inputs. The evaluation of these inputs may require such actions as loading and executing test vectors on an automated test system. In some embodiments, the process may evaluate a sub-set of available inputs based on various criteria, such as test data analysis. The evaluation of inputs may be performed, for example, when examining circuitry as described above in reference to input paths 2220-2340 of RMUX 2210, or inputs 2330-2340 of element 2300.

After evaluating the inputs or determining (at 2410) that there are no untested inputs, the process next determines (at 2430) whether there are untested outputs. When there are, the process evaluates (at 2440) each of the untested outputs. In some embodiments, based on various criteria, the process may evaluate a sub-set of the available outputs. The evaluation of outputs may be performed, for example, when examining circuitry as described above in reference to transistors 2350 and 2360 connected to outputs 2370 and 2380, respectively, of element 2300.

Next, the process determines (at 2450) if there are other relevant properties of the element that may be tested (e.g., transition from a 1 to 0 when the element previously failed a transition from a 0 to 1, selecting a different launch element, selecting a different capture element, etc.). When there are, the process evaluates (at 2460) those properties or a sub-set of those properties. When the process determines (at 2450) that there are no other properties to evaluate, the process ends.

One of ordinary skill in the art will recognize that process 2400 is a conceptual representation of the operations used to perform fault isolation. The specific operations of the process may not be performed in the exact order described or different specific operations may be performed in different embodiments. For instance, in addition to the operations described above, the process may decompose a particular element or pathway into sub-elements and/or shorter pathways and evaluate those sub-elements or shortened paths. Also, the process may not be performed as one continuous series of operations. Furthermore, the process could be implemented using several sub-processes, or as part of a larger macro-process.

IV. Generation of Test Vectors

Figure 25:
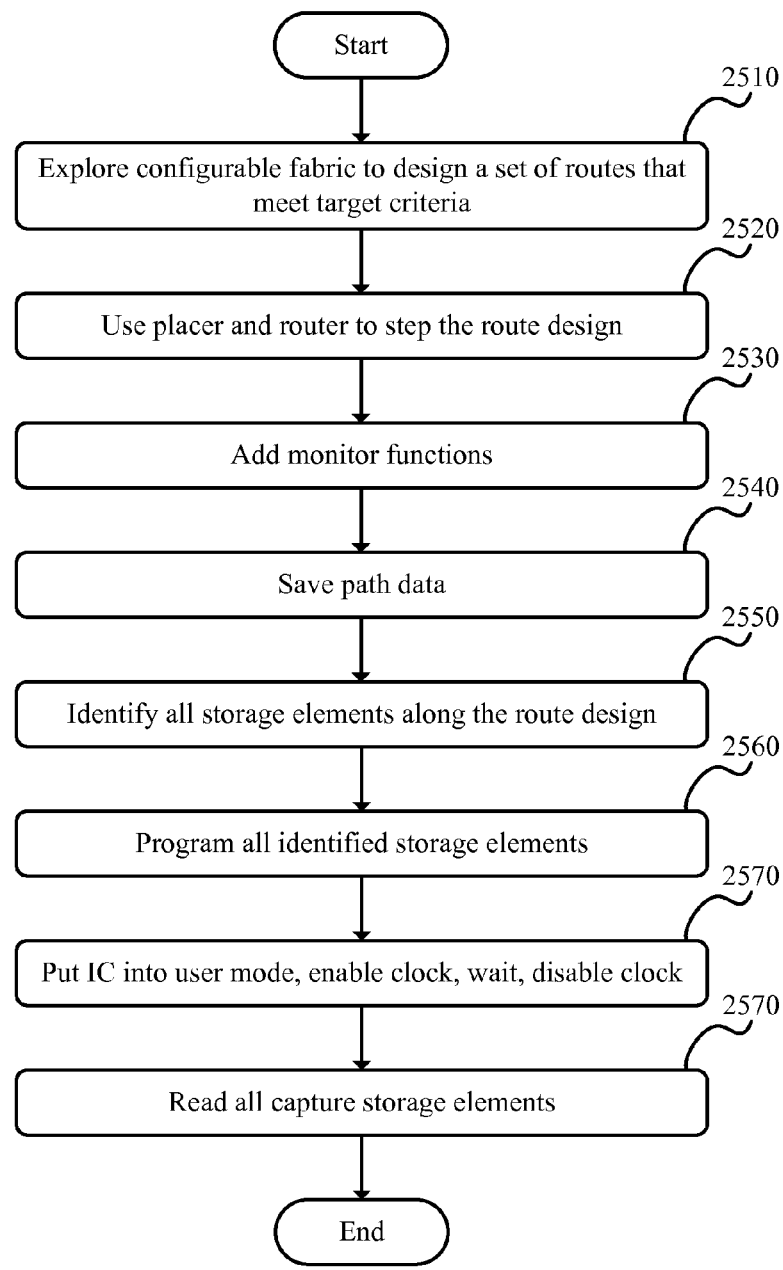
FIG. 25 illustrates a conceptual process used by some embodiments to generate a set of test vectors to be used when performing launch-capture testing.

FIG. 25 illustrates a conceptual process 2500 used by some embodiments to generate a set of test vectors to be used when performing launch-capture testing. The process will be described with reference to FIG. 26.

Figure 26:
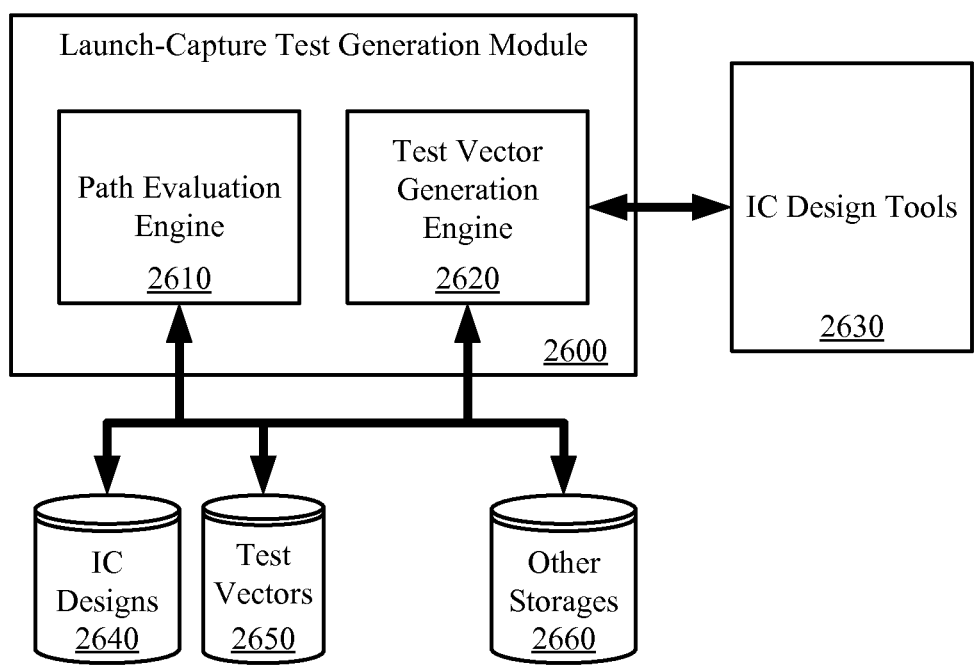
FIG. 26 illustrates a conceptual diagram showing one possible implementation of a launch-capture test generation module.

FIG. 26 illustrates a conceptual diagram showing one possible implementation of a launch-capture test generation module 2600. Specifically, this figure shows one example module that may be used to generate a set of test vectors to perform launch-capture testing. Such a module may be used in conjunction with a set of IC design tools (e.g., extraction tools, placement and routing tools, etc.). As shown, the module includes a path evaluation engine 2610 for examining configurable IC design information and a vector generation engine 2620 for creating a set of test patterns. In addition, the module has access to a set of other IC design tools 2630 for performing various IC design operations, an IC design storage 2640 for storing various IC design information, a vector storage 2650 for storing test vectors, and/or other storages 2660 for storing various information.

The process starts by accessing a set of IC design tools. The process then explores (at 2510) the configurable fabric of the IC (i.e., the configurable elements of the IC) that will be tested, in order to identify and design a set of routes that meet certain target criteria. In some embodiments, this exploration of the configurable fabric may be performed by a module such as the path evaluation engine 2610 after loading an abstract representation of a configurable IC design from the IC design storage 2640 and a set of test criteria from the other storages 2660.

In some embodiments, the process may automatically explore the configurable fabric of the IC using a script (e.g., by using a TCL script to interface with an extraction tool). The target criteria may be criteria such as minimum and/or maximum delay time, minimum and/or maximum number of elements in a path, various performance criteria, etc. In addition, the target criteria may include avoiding routing through resources with multiple input sources, routing through elements that have not been tested by previously-design routes, etc. Furthermore, the target criteria may specifically target particular circuitry and/or regions of the IC for certain types of analysis. These identified routes may be designed using a module such as the vector generation engine 2620, which generates the appropriate test vectors to configure the designed paths of an IC under test.

Next, the process uses (at 2520) a placer and router to step the designed test route across the IC. In some embodiments, the placer and router and stepper are TCL-based operations. In some cases, the launch-capture test generation module 2600 may automatically direct other IC design tools 2630 to perform such an operation. Stepping the designed route across the IC allows parallel testing of a vast amount of IC resources. As above, the vector generation engine 2620 may generate (or add to existing) test vectors that will configure an IC under test.

The process then adds (at 2530) monitor functions to the test design. These monitor functions may include functionality such as monitoring the sub-cycle of operation described above in reference to FIG. 19. Next, the process saves (at 2540) data regarding the designed path. This data may include information such as the number of elements in the path, the IC for which the path was designed, launch element, capture element, etc.

Next, the process identifies (at 2550) the storage elements along the designed test route. Some embodiments may identify these storage elements using a script to automatically evaluate the designed path. In some embodiments, this identification of storage elements may be performed by a module such as the path evaluation engine 2610 using the previously-loaded configurable IC design.

The process then programs (at 2560) the identified storage elements. This programming is conceptual (i.e., the storage elements are not programmed until an IC is being tested), and consists of generating (or adding to existing) test vectors. These test vectors may be generated using a module such as the vector generation engine 2620. The storage elements are programmed such that the elements along the test path are all open (or transparent) while the capture elements are open during the transition cycle and closed during all others. In some cases, such programming may include programming a clock signal to stop during a certain sub-cycle (e.g., when a clocked storage element is used as a capture element).

The process then generates (at 2570) or adds to test vectors such that the test vectors include signals to put the IC into user mode, enable the clock, wait (and collect test data), and disable the clock. The generation of or addition to test vectors may be performed by a module such as the vector generation engine 2620.

The process then reads (at 2570) all capture storage elements to collect the generated test data. In some embodiments, this data is also validated by determining the sub-cycle when operation was disabled (and the sub-cycle of valid data for that capture element). As above, the reading of the storage elements occurs at run-time by executing a set of test vectors. These test vectors may be generated by a module such as the vector generation engine 2620. These test vectors (and other test vectors generated by process 2500) may be stored in a storage such as vector storage 2650. In some embodiments, the test vectors that read the capture elements include explicit comments that identify the tested path associated with each capture element.

One of ordinary skill in the art will recognize that process 2500 is a conceptual representation of the operations used to generate test vectors. The specific operations of the process may not be performed in the exact order described or different specific operations may be performed in different embodiments. For instance, in addition to the operations described above, the process may decompose a particular element or pathway into sub-elements and/or shorter pathways and evaluate those sub-elements or shortened paths. Also, the process may not be performed as one continuous series of operations. Furthermore, the process could be implemented using several sub-processes, or as part of a larger macro-process.

V. Computer System

Many of the above-described processes, methods, and modules are implemented as software processes that are specified as a set of instructions recorded on a computer readable storage medium (also referred to as "computer readable medium" or "machine readable medium"). When these instructions are executed by one or more computational or processing element(s), such as processors or other computational elements like Application-Specific ICs ("ASIC") and Field Programmable Gate Arrays ("FPGA"), they cause the computational element(s) to perform the actions indicated in the instructions. Computer is meant in its broadest sense, and can include any electronic device with computational elements a processor. Examples of computer readable media include, but are not limited to, CD-ROMs, flash drives, RAM chips, hard drives, EPROMs, etc. The computer readable media does not include carrier waves and/or electronic signals passing wirelessly or over wired connections.

In this specification, the term "software" includes firmware residing in read-only memory or applications stored in magnetic storage which can be read into memory for processing by one or more processors. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described herein is within the scope of the invention. In some embodiments, the software programs when installed to operate on one or more computer systems define one or more specific machine implementations that execute and perform the operations of the software programs.

Figure 27:
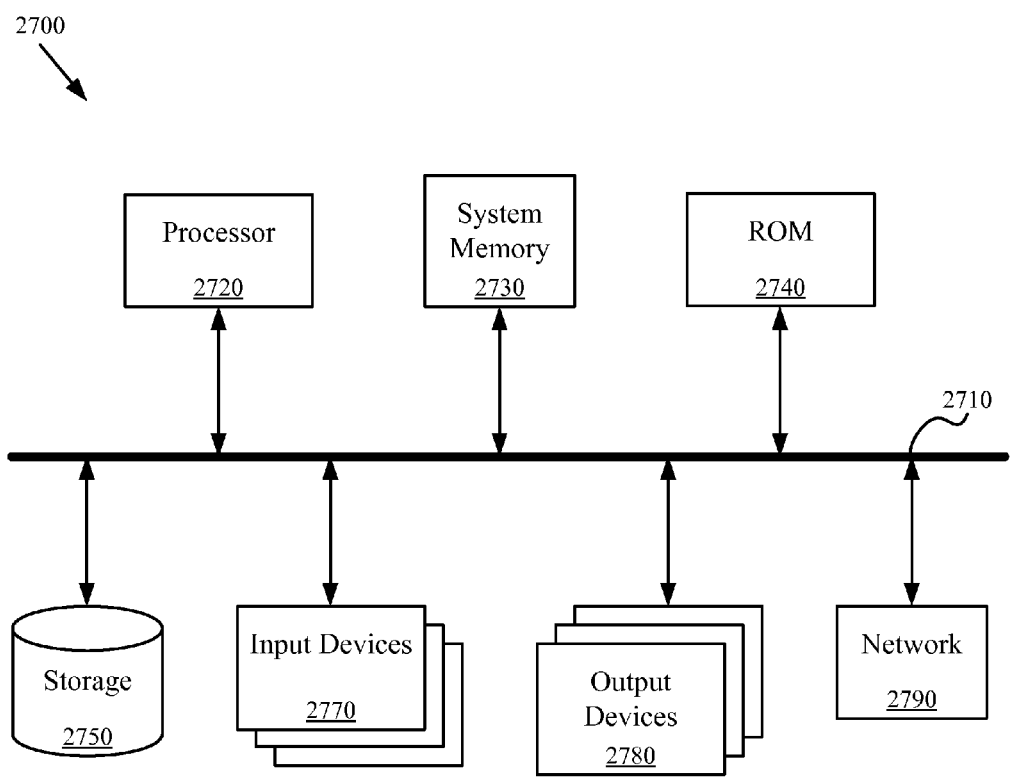
FIG. 27 illustrates a computer system with which some embodiments of the invention are implemented.

FIG. 27 conceptually illustrates a computer system 2700 with which some embodiments of the invention are implemented. For example, the system described above in reference to FIG. 6 may be at least partially implemented using sets of instructions that are run on the computer system 2700. As another example, the processes described in reference to FIGS. 24 and 25 may be at least partially implemented using sets of instructions that are run on the computer system 2700.

Such a computer system includes various types of computer readable mediums and interfaces for various other types of computer readable mediums. Computer system 2700 includes a bus 2710, a processor 2720, a system memory 2730, a read-only memory (ROM) 2740, a permanent storage device 2750, input devices 2770, output devices 2780, and a network connection 2790. The components of the computer system 2700 are electronic devices that automatically perform operations based on digital and/or analog input signals.

One of ordinary skill in the art will recognize that the computer system 2700 may be embodied in other specific forms without deviating from the spirit of the invention. For instance, the computer system may be implemented using various specific devices either alone or in combination. For example, a local PC may include the input devices 2770 and output devices 2780, while a remote PC may include the other devices 2710-2750, with the local PC connected to the remote PC through a network that the local PC accesses through its network connection 2790 (where the remote PC is also connected to the network through a network connection).

The bus 2710 collectively represents all system, peripheral, and chipset buses that communicatively connect the numerous internal devices of the computer system 2700. In some cases, the bus 2710 may include wireless and/or optical communication pathways in addition to or in place of wired connections. For example, the input devices 2770 and/or output devices 2780 may be coupled to the system 2700 using a wireless local area network (W-LAN) connection, Bluetooth®, or some other wireless connection protocol or system.

The bus 2710 communicatively connects, for example, the processor 2720 with the system memory 2730, the ROM 2740, and the permanent storage device 2750. From these various memory units, the processor 2720 retrieves instructions to execute and data to process in order to execute the processes of the invention. In some embodiments the processor includes an FPGA, an ASIC, or various other electronic components for execution instructions.

The ROM 2740 stores static data and instructions that are needed by the processor 2720 and other modules of the computer system. The permanent storage device 2750, on the other hand, is a read-and-write memory device. This device is a non-volatile memory unit that stores instructions and data even when the computer system 2700 is off. Some embodiments of the invention use a mass-storage device (such as a magnetic or optical disk and its corresponding disk drive) as the permanent storage device 2750.

Other embodiments use a removable storage device (such as a floppy disk, flash drive, or CD-ROM) as the permanent storage device. Like the permanent storage device 2750, the system memory 2730 is a read-and-write memory device. However, unlike storage device 2750, the system memory 2730 is a volatile read-and-write memory, such as a random access memory (RAM). The system memory stores some of the instructions and data that the processor needs at runtime. In some embodiments, the sets of instructions used to implement the invention's processes are stored in the system memory 2730, the permanent storage device 2750, and/or the read-only memory 2740. For example, the various memory units include instructions for processing multimedia items in accordance with some embodiments.

The bus 2710 also connects to the input devices 2770 and output devices 2780. The input devices 2770 enable the user to communicate information and select commands to the computer system. The input devices include alphanumeric keyboards and pointing devices (also called "cursor control devices"). The input devices also include audio input devices (e.g., microphones, MIDI musical instruments, etc.) and video input devices (e.g., video cameras, still cameras, optical scanning devices, etc.). The output devices 2780 include printers, electronic display devices that display still or moving images, and electronic audio devices that play audio generated by the computer system. For instance, these display devices may display a GUI. The display devices include devices such as cathode ray tubes ("CRT"), liquid crystal displays ("LCD"), plasma display panels ("PDP"), surface-conduction electron-emitter displays (alternatively referred to as a "surface electron display" or "SED"), etc. The audio devices include a PC's sound card and speakers, a speaker on a cellular phone, a Bluetooth® earpiece, etc. Some or all of these output devices may be wirelessly or optically connected to the computer system.

Finally, as shown in FIG. 27, bus 2710 also couples computer system 2700 to a network 2790 through a network adapter (not shown). In this manner, the computer can be a part of a network of computers (such as a local area network ("LAN"), a wide area network ("WAN"), an Intranet, or a network of networks, such as the Internet. For example, the computer system 2700 may be coupled to a web server (network 2790) so that a web browser executing on the computer system 2700 can interact with the web server as a user interacts with a GUI that operates in the web browser.

Some embodiments include electronic components, such as microprocessors, storage and memory that store computer program instructions in a machine-readable or computer-readable media (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable blu-ray discs, ultra density optical discs, any other optical or magnetic media, and floppy disks. The computer-readable media may store a computer program that is executable by a device such as an electronics device, a microprocessor, a processor, a multi-processor (e.g., an IC with several processing units on it) and includes sets of instructions for performing various operations. The computer program excludes any wireless signals, wired download signals, and/or any other ephemeral signals.

Examples of hardware devices configured to store and execute sets of instructions include, but are not limited to, ASICs, FPGAs, programmable logic devices ("PLDs"), ROM, and RAM devices. Examples of computer programs or computer code include machine code, such as produced by a compiler, and files including higher-level code that are executed by a computer, an electronic component, or a microprocessor using an interpreter.

As used in this specification and any claims of this application, the terms "computer", "server", "processor", and "memory" all refer to electronic or other technological devices. These terms exclude people or groups of people. For the purposes of this specification, the terms display or displaying mean displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and/or any other ephemeral signals.

It should be recognized by one of ordinary skill in the art that any or all of the components of computer system 2700 may be used in conjunction with the invention. Moreover, one of ordinary skill in the art will appreciate that any other system configuration may also be used in conjunction with the invention or components of the invention.

While the invention has been described with reference to numerous specific details, one of ordinary skill in the art will recognize that the invention can be embodied in other specific forms without departing from the spirit of the invention. For example, several embodiments were described above by reference to particular media editing applications with particular features and components (e.g., particular composite display areas). However, one of ordinary skill will realize that other embodiments might be implemented with other types of media editing applications with other types of features and components (e.g., other types of composite display areas).

Moreover, while the examples shown illustrate certain individual modules as separate blocks (e.g., the path evaluation engine 2610, the vector generation engine 2620, etc.), one of ordinary skill in the art would recognize that some embodiments may combine these modules into a single functional block or element. One of ordinary skill in the art would also recognize that some embodiments may divide a particular module into multiple modules.

One of ordinary skill in the art will realize that, while the invention has been described with reference to numerous specific details, the invention can be embodied in other specific forms without departing from the spirit of the invention. For instance, alternate embodiments may be implemented using different specific test hardware configurations. One of ordinary skill in the art would understand that the invention is not to be limited by the foregoing illustrative details, but rather is to be defined by the appended claims.

I claim:

1. An integrated circuit (IC) comprising:
   a plurality of configurable circuits, each configurable circuit for configurably performing operations according to a configuration data set;
   a launch element for providing a set of test stimulus;
   a capture element for capturing a set of responses to the set of test stimulus by a circuitry under test, wherein the circuitry under test comprises a set of the plurality of configurable circuits configured to perform a set of operations in a user mode; and
   a debug network for retrieving the captured set of responses.

2. The IC of claim 1 further comprising a plurality of signal lines for supplying at least a clock signal and a control signal that allow the IC to operate in the user mode while the circuitry under test is stimulated by the set of test stimulus.

3. The IC of claim 1, wherein the launch element comprises at least one of a configurable look-up table, a configurable storage element, and a configurable multiplexer.

4. The IC of claim 1, wherein the capture element comprises a latch that is controlled by a configuration data set, wherein the configuration data set causes the latch to pass data in one operation cycle and hold data in an immediate subsequent operation cycle.

5. The IC of claim 4, wherein the data held in the latch is retrieved for analysis using the debug network.

6. The IC of claim 1, wherein the plurality of configurable circuits comprises a plurality of configurable logic circuits for configurably performing a plurality of logic operations, a plurality of configurable routing circuits for configurably passing signals among circuits of the IC, and a plurality of controllable storage elements for controllably storing signals as the signals transit between the circuits of the IC.

7. The IC of claim 1, wherein the captured set of responses are used to determine whether the circuitry under test satisfies a set of evaluation criteria.

8. An integrated circuit (IC) comprising:
   a first set of configurable circuits for providing a test stimulus;
   a second set of configurable circuits for performing a set of operations in a user mode based on the test stimulus;
   a third set of configurable circuits for capturing a set of output values produced by the second set of configurable circuits while performing the set of operations; and
   a debug network for accessing the set of output values captured in the third set of configurable circuits.

9. The IC of claim 8 further comprising a plurality of signal lines for supplying at least a clock signal and a control signal that allow the IC to operate in the user mode while the second set of configurable circuits is stimulated by the set of test stimulus.

10. The IC of claim 8, wherein the first set of configurable circuits comprises at least one of a configurable look-up table, a configurable storage element, and a configurable multiplexer.

11. The IC of claim 8, wherein the second set of configurable circuits comprises a plurality of configurable logic circuits for configurably performing a plurality of logic operations, a plurality of configurable routing circuits for configurably passing signals among circuits of the IC, and a plurality of controllable storage elements for controllably storing signals as the signals transit between the circuits of the IC.

12. The IC of claim 8, wherein the third set of configurable circuits comprises a latch that is controlled by a configuration data set, wherein the configuration data set causes the latch to pass data in one operation cycle and hold data in an immediate subsequent operation cycle.

13. The IC of claim 12, wherein the data held in the latch is retrieved for analysis using the debug network.

14. The IC of claim 8, wherein the second and third sets of configurable circuits are for performing other operations in addition to respectively performing the set of operations in the user mode based on the test stimulus and capturing the set of output values produced by the second set of configurable circuits in response to the test stimulus.

15. A non-transitory computer readable medium storing sets of configuration data for configuring an integrated circuit (IC) to test a set of circuitry in the IC, the IC comprising a plurality of configurable logic circuits for configurably performing a plurality of logic operations, a plurality of configurable routing circuits for configurably passing signals among the circuits of the IC, a plurality of controllable storage elements for controllably storing signals as the signals transit between the configurable circuits, and a debug network that accesses the controllable storage elements, the sets of configuration data comprising:
   a set of configuration data for configuring the IC to operate in a user mode, the configured IC having a set of test paths, each test path comprising a set of configurable logic circuits, a set of configurable routing circuits, and at least one controllable storage element; and
   a set of configuration data for configuring the debug network to read values stored in storage elements along the set of test paths to determine whether the set of circuitry in the IC is operating within specified performance limits according to a set of test criteria.

16. The non-transitory computer readable medium of claim 15, wherein the set of configuration data further comprises:
   a set of configuration data for configuring a set of configurable circuits for providing a test stimulus to the set of test paths; and
   a set of configuration data for configuring the controllable storage elements along the set of test paths for capturing a set of output values produced by the set of test paths.

17. The non-transitory computer readable medium of claim 15, wherein at least one controllable storage element is a configurable storage element for controllably storing a signal that the storage element receives based on a set of configuration data supplied to the storage element.

18. The non-transitory computer readable medium of claim 15, wherein the set of test criteria comprises a set of timing constraints.

19. The non-transitory computer readable medium of claim 15, wherein the set of test criteria comprises a set of expected logic values.

20. A non-transitory computer readable medium storing sets of configuration data for configuring an integrated circuit (IC) comprising a plurality of configurable logic circuits for configurably performing a plurality of logic operations, a configurable routing fabric for passing signals among the circuits of the IC, a plurality of configurable storage elements placed throughout the configurable routing fabric for controllably storing signals passed along the configurable routing fabric, and a debug network that accesses the configurable storage elements, the sets of configuration data comprising:

a set of configuration data for configuring a first set of configurable circuits to operate as a launch element;

a set of configuration data for configuring a second set of configurable circuits to operate as a capture element;

a set of configuration data for defining a set of circuitry in the IC as a set of test paths, wherein each test path is stimulated by a particular configurable circuit in the launch element and terminated at a particular configurable circuit in the capture element.

21. The non-transitory computer readable medium of claim 20, wherein the set of configuration data configuring the first set of configurable circuits to operate as the launch element comprises a set of instructions for receiving a set of test vectors and for providing a set of stimulus to the set of test paths based on the received test vectors.

* * * * *